US007686935B2

(12) United States Patent
Mayer et al.

(10) Patent No.: US 7,686,935 B2
(45) Date of Patent: Mar. 30, 2010

(54) PAD-ASSISTED ELECTROPOLISHING

(75) Inventors: Steven T. Mayer, Lake Oswego, OR (US); Julia Svirchevski, Santa Clara, CA (US); John Stephen Drewery, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 1251 days.

(21) Appl. No.: 11/213,190

(22) Filed: Aug. 26, 2005

(65) Prior Publication Data

US 2009/0277802 A1 Nov. 12, 2009

Related U.S. Application Data

(63) Continuation-in-part of application No. 10/609,518, filed on Jun. 30, 2003, now abandoned, application No. 11/213,190, which is a continuation-in-part of application No. 10/739,822, filed on Dec. 17, 2003, now Pat. No. 7,449,098, which is a continuation-in-part of application No. 09/967,075, filed on Sep. 28, 2001, now Pat. No. 6,709,565, which is a continuation-in-part of application No. 09/412,837, filed on Oct. 5, 1999, now Pat. No. 6,315,883, application No. 11/213,190, which is a continuation-in-part of application No. 10/274,755, filed on Oct. 21, 2002, now Pat. No. 7,070,686, which is a continuation-in-part of application No. 09/542,890, filed on Apr. 4, 2000, now Pat. No. 6,514,393, and a continuation-in-part of application No. 10/116,077, filed on Apr. 4, 2002, now Pat. No. 6,755,954, which is a continuation-in-part of application No. 09/537,467, filed on Mar. 27, 2000, now Pat. No. 6,402,923, application No. 11/213,190, which is a continuation-in-part of application No. 10/916,374, filed on Aug. 10, 2004, now Pat. No. 6,919,010, and a continuation-in-part of application No. 10/154,082, filed on May 22, 2002, now Pat. No. 6,773,571, application No. 11/213,190, which is a continuation-in-part of application No. 10/690,084, filed on Oct. 20, 2003, now Pat. No. 7,338,908.

(60) Provisional application No. 60/392,203, filed on Jun. 28, 2002, provisional application No. 60/105,700, filed on Oct. 26, 1998, provisional application No. 60/580,572, filed on Jun. 16, 2004, provisional application No. 60/302,111, filed on Jun. 28, 2001.

(51) Int. Cl.
*B23H 5/06* (2006.01)
(52) U.S. Cl. ...................................... 205/662; 205/668
(58) Field of Classification Search ................. 205/662, 205/668
See application file for complete search history.

(56) References Cited

U.S. PATENT DOCUMENTS 5,486,234 A 1/1996 Contolini et al.

(Continued)

*Primary Examiner*—Harry D. Wilkins, III
*Assistant Examiner*—Nicholas A. Smith
(74) *Attorney, Agent, or Firm*—Weaver Austin Villeneuve & Sampson LLP

(57) ABSTRACT

Pad-assisted electropolishing of the substrate is conducted by performing anodic dissolution of metal at a first portion of the substrate and simultaneously mechanically buffing a second portion of the substrate with a buffing pad. Anodic dissolution includes forming a thin liquid layer of electropolishing liquid between the anodic substrate and a cathodic electropolishing head. The location of electrical contacts between the substrate and power supply allow peripheral edge regions of the substrate to be mechanically buffed with the pad. Preferably, a substrate is further planarized using an isotropic material-removal technique. An apparatus includes an electropolishing head that is movable to a position proximate to a first portion of a substrate to form a thin gap, and a buffing pad that mechanically buffs a second portion of the substrate using minimal pressure.

35 Claims, 15 Drawing Sheets

U.S. PATENT DOCUMENTS

| | | | |
|---|---|---|---|
| 5,807,165 A | 9/1998 | Uzoh et al. | |
| 6,066,030 A | 5/2000 | Uzoh | |
| 6,309,981 B1 | 10/2001 | Mayer et al. | |
| 6,315,883 B1 | 11/2001 | Mayer et al. | |
| 6,328,872 B1 | 12/2001 | Talieh et al. | |
| 6,379,223 B1 | 4/2002 | Sun et al. | |
| 6,440,295 B1 | 8/2002 | Wang | |
| 6,482,307 B2 | 11/2002 | Ashjaee et al. | |
| 6,497,800 B1 | 12/2002 | Talieh et al. | |
| 6,527,920 B1 | 3/2003 | Mayer et al. | |
| 6,534,116 B2 | 3/2003 | Basol | |
| 6,537,416 B1 | 3/2003 | Mayer et al. | |
| 6,582,281 B2 | 6/2003 | Doan et al. | |
| 6,586,342 B1 | 7/2003 | Mayer et al. | |
| 6,610,190 B2 | 8/2003 | Basol et al. | |
| 6,612,915 B1 | 9/2003 | Uzoh et al. | |
| 6,634,935 B2 | 10/2003 | Young et al. | |
| 6,664,122 B1 | 12/2003 | Andryuschenko et al. | |
| 6,706,158 B2 | 3/2004 | Sharan | |
| 6,709,565 B2 | 3/2004 | Mayer et al. | |
| 6,716,334 B1 | 4/2004 | Reid et al. | |
| 6,739,951 B2 | 5/2004 | Sun et al. | |
| 6,755,946 B1 | 6/2004 | Patton et al. | |
| 6,756,307 B1 | 6/2004 | Kelly et al. | |
| 6,773,576 B2 | 8/2004 | Volodarsky et al. | |
| 6,776,693 B2 | 8/2004 | Duboust et al. | |
| 6,790,130 B2 | 9/2004 | Doan et al. | |
| 6,797,132 B2 | 9/2004 | Talieh et al. | |
| 6,800,187 B1 | 10/2004 | Reid et al. | |
| 6,811,680 B2 | 11/2004 | Chen et al. | |
| 6,815,349 B1 | 11/2004 | Minshall et al. | |
| 6,818,066 B2 | 11/2004 | Cheung | |
| 6,821,409 B2 | 11/2004 | Basol et al. | |
| 6,841,057 B2 | 1/2005 | Wadensweiler et al. | |
| 6,846,224 B2 | 1/2005 | Ki | |
| 6,867,136 B2 | 3/2005 | Basol et al. | |
| 2002/0011416 A1 | 1/2002 | Landau et al. | |
| 2003/0089615 A1 | 5/2003 | Basol et al. | |
| 2003/0141201 A1* | 7/2003 | Basol | 205/668 |
| 2003/0217932 A1 | 11/2003 | Talieh et al. | |
| 2004/0007478 A1 | 1/2004 | Basol et al. | |
| 2004/0134793 A1 | 7/2004 | Uzoh et al. | |
| 2004/0163950 A1 | 8/2004 | Emesh | |
| 2004/0195111 A1 | 10/2004 | Talieh et al. | |
| 2004/0224511 A1 | 11/2004 | Pillion et al. | |
| 2005/0145484 A1 | 7/2005 | Basol et al. | |

* cited by examiner

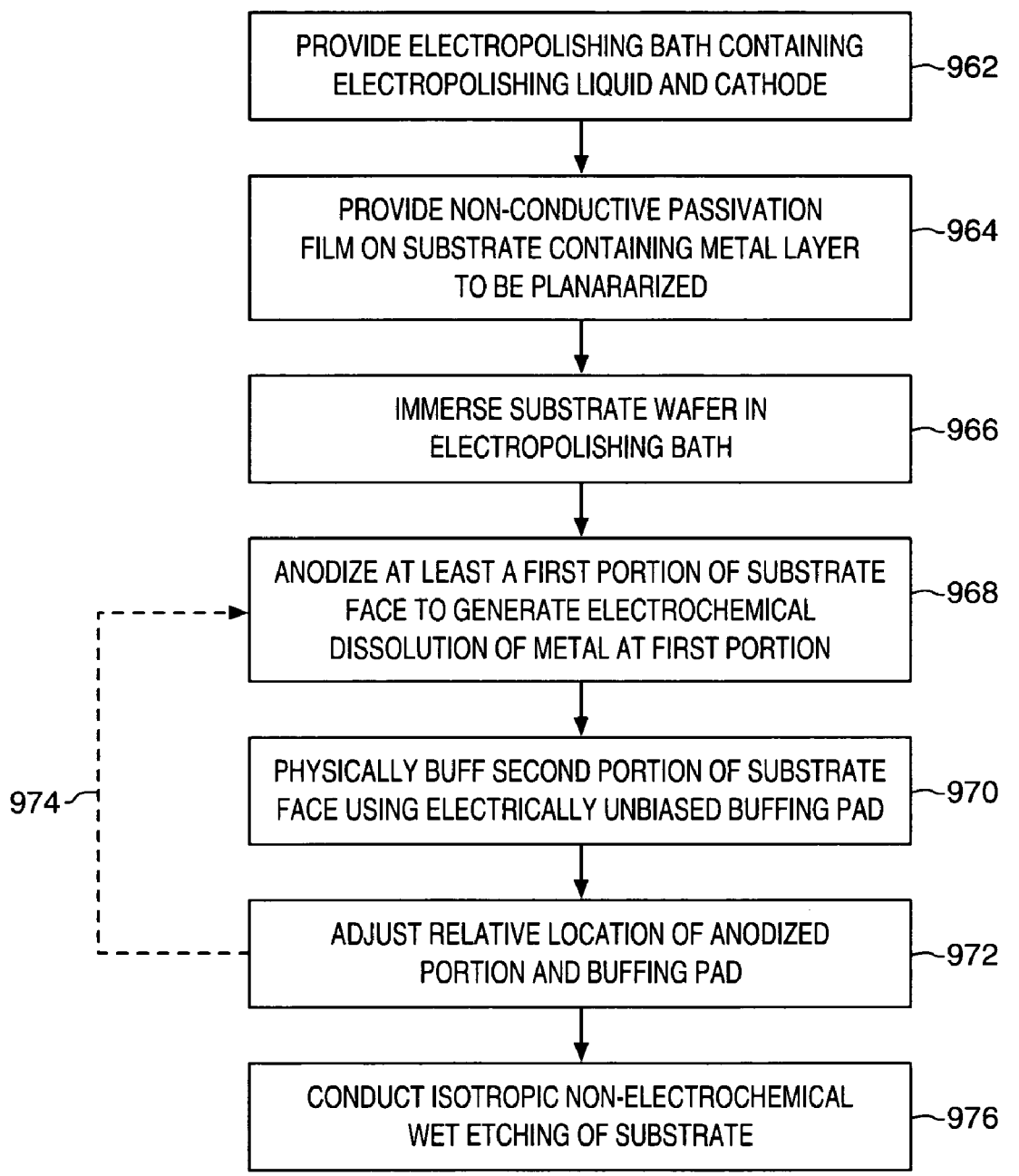

PAD-ASSISTED ELECTROPOLISHING

RELATED APPLICATIONS

This application is a continuation-in-part application, claiming priority under 35 USC 120, of co-owned U.S. patent application Ser. No. 10/609,518, filed Jun. 30, 2003, now abandoned by Mayer et al., having the title "Liquid Treatment Using Thin Liquid Layer", which claimed the benefit of U.S. Provisional Application Ser. No. 60/392,203, filed Jun. 28, 2002. This application is also a continuation-in-part application, claiming priority under 35 USC 120, of co-owned U.S. patent application Ser. No. 10/739,822, filed Dec. 17, 2003, by Mayer et al., having the title "Method for Planar Electroplating", now issued U.S. Pat. No. 7,449,098, which is a continuation-in-part of U.S. patent application Ser. No. 09/967,075, filed Sep. 28, 2001 by Mayer et al., titled "Method And Apparatus For Uniform Electropolishing of Damascene IC Structures By Selective Agitation," now issued U.S. Pat. No. 6,709,565, which in turn was a continuation-in-part of U.S. patent application Ser. No. 09/412,837 filed Oct. 5, 1999 by Mayer et al., and titled "Electroplanarization of Large and Small Damascene Features Using Diffusion Barriers and Electropolishing," now issued U.S. Pat. No. 6,315,883, which claimed the benefit of U.S. Provisional Application Ser. No. 60/105,700, filed Oct. 26, 1998. This application is also a continuation-in-part application, claiming priority under 35 USC 120, of co-owned U.S. patent application Ser. No. 10/274,755, filed Oct. 21, 2002, by Contolini et al., titled "Dynamically Variable Field Shaping Element", now issued U.S. Pat. No. 7,070,686, which in turn was a continuation-in-part application of U.S. patent application Ser. No. 09/542,890 filed Apr. 4, 2000, by Contolini et al., now issued U.S. Pat. No. 6,514,393, and which was also a continuation-in-part application of U.S. patent application Ser. No. 10/116,077 filed Apr. 4, 2002, by Mayer et al., titled "Electrochemical Treatment Of Integrated Circuit Substrates Using Concentric Anodes And Variable Field Shaping Elements", now issued U.S. Pat. No. 6,755,954, which in turn was a continuation-in-part application of U.S. patent application Ser. No. 09/537,467 filed Mar. 27, 2000, by Mayer et al., now issued U.S. Pat. No. 6,402,923. This application is also a continuation-in-part application, claiming priority under 35 USC 120, of co-owned U.S. patent application Ser. No. 10/916,374, filed Aug. 10, 2004, now issued U.S. Pat. No. 6,919,010, which claimed the benefit of U.S. provisional Application Ser. No. 60/580,572, filed Jun. 16, 2004, and which was also a continuation-in-part application of U.S. patent application Ser. No. 10/154,082, filed May 22, 2002, now U.S. Pat. No. 6,773,571, which claimed the benefit of U.S. provisional Application Ser. No. 60/302,111, filed Jun. 28, 2001. This application is also a continuation-in-part application, claiming priority under 35 USC 120, of co-owned U.S. patent application Ser. No. 10/690,084, filed Oct. 20, 2003, by Koos et al., titled "Method For Fabrication Of Semiconductor Interconnect Structure With Reduced Capacitance, Leakage Current, And Improved Breakdown Voltages," now issued U.S. Pat. No. 7,338,908. These prior patent documents are incorporated herein by reference for all purposes.

FIELD OF THE INVENTION

The invention is related to the field of integrated circuit fabrication, in particular to methods and systems for planarizing metal-containing surfaces using electropolishing techniques.

BACKGROUND OF THE INVENTION

Integrated circuits are formed on wafers by well-known processes and materials. These processes typically include the deposition of thin film layers by sputtering, metal-organic decomposition, chemical vapor deposition, plasma vapor deposition, and other techniques. These layers are processed by a variety of well-known etching technologies and subsequent deposition steps to provide a completed integrated circuit.

A crucial component of integrated circuits is the wiring or metallization layer that interconnects the individual circuits. Conventional metal deposition techniques include physical vapor deposition, e.g., sputtering and evaporation, and chemical vapor deposition techniques. Some integrated circuit manufacturers have developed electrochemical deposition techniques to deposit primary conductor films on semiconductor substrates.

Wiring layers traditionally contained aluminum and a plurality of other metal layers that are compatible with the aluminum. In 1997, IBM introduced technology that facilitated a transition from aluminum to copper wiring layers. This technology has demanded corresponding changes in process architecture towards damascene and dual damascene architecture, as well as new process technologies.

A typical damascene or dual damascene process flow scheme for fabricating copper interconnects, such as copper lines and vias, typically includes: forming a trench pattern on a layer dielectric layer using an etch-resistant photoresist; etching a trench pattern; removing the photoresist; forming a via pattern on a dielectric material using etch resistant photoresist; etching vias; removing resist; depositing a tantalum barrier and a copper seed layer using PVD; electroplating copper to fill the etched features; and polishing copper off the wafer face leaving copper-filled interconnect circuitry.

As the number of levels in an interconnect technology is increased, the stacking of additional layers produces more rugged topography. Compounding this problem, electroplating bath additives are now commonly utilized to promote rapid "bottom-up" filling of high aspect-ratio features in damascene copper electroplating processes to ensure homogeneous metal fill of narrow features. Baths with "bottom-up" filling characteristics fill smaller features more rapidly than baths without such additives. Baths with "bottom-up" filling characteristics are designed to fill smaller features more rapidly than larger features. In some cases (e.g., plating baths with superior bottom-up filling characteristics and little or no leveling additives), plating continues at an accelerated rate after completing the small-feature filling stage. When many high-aspect ratio features are located in close proximity, a macroscopic raised area (series of bumps or a raised plateau) forms. This bump formation is also termed "feature overplating".

The use of advanced "bottom-up" electrofilling techniques with wafers having low and high aspect-ratio features has created a problem of deposited metal surfaces with a wide range of topography, that is, topography containing both recessed and raised areas. Commonly, features vary in size by two orders of magnitude on a single layer. A 0.5 μm-deep feature can have widths of from 0.1 μm to 100 μm. Therefore, while electroplating is the preferred method of metalization, various aspects of improved plating regimens create challenging topography for subsequent planarization.

Chemical mechanical planarization (CMP) is one process used to remove excess material from a surface. It typically includes the use of a polishing pad and a solution containing an abrasive along with passivating agents and/or chemical agents that either retard or assist the planing of the material. CMP may be used for planing portions of wafers comprising dielectrics, such as silicon dioxide, or metals, such as copper, aluminum or tungsten. In copper CMP processes, excess copper is planed, or polished, off the top of the wafer surface to expose the thin pattern lines of copper metal inlaid within the barrier layer or substrate material. Polishing of the substrate is conducted until the underlying substrate is exposed, a condition commonly referred to as breakthrough. For copper CMP, breakthrough is defined as removal of metal from the top of the substrate until the underlying barrier layer or dielectric is first exposed. Breakthrough can be detected by optical reflectance from the substrate, by changes in polishing wheel temperature, by changes in polishing wheel torque, or by changes in chemical composition of used polishing solution. Once the excess copper is removed by the polishing step, the wafer must be cleaned with additional chemicals and soft pads to remove the abrasive particles that adhere to the wafer.

Metal polish slurries are designed to polish and to planararize conductive layers on semiconductor wafer substrates. The conductive layers are typically deposited on a dielectric layer and typically comprise metals such as tungsten (W), titanium (Ti), aluminum (Al), copper (Cu), alloys thereof, semiconductor such as doped silicon (Si), doped polysilicon, and refractory metal silicides. The dielectric layer typically contains openings (e.g., vias and trenches) that are filled with the conductive material to provide a path through the dielectric layer to previously deposited layers and to circuit devices. After the conductive layer is polished, only the conductive material filling the features remains in the dielectric layer.

Metal polish slurries utilized for CMP of vias typically include very small particles (i.e., in a range of about from 20 to 1000 nm diameter) of the above-mentioned abrasive materials, suspended in a water-based liquid at a concentration of about from 1 to 7 weight percent. The pH may be acidic (i.e., <5) or neutral and is obtained and controlled by addition of acid(s) or salt(s) thereof. In addition to the organic acid(s) or salt(s), metal polishing slurries often include one or more oxidizing agents for assisting metal dissolution and removal, typically selected from hydrogen peroxide, potassium ferricyanide, ferric nitrate, or combinations thereof.

To create advanced semiconductor devices that contain multiple levels of metal lines in a dielectric requires the use of new dielectric materials. These new dielectric materials are commonly referred to as low-k dielectrics. Compared to traditional silicon dioxide dielectric, the newer low-k dielectrics are softer and less tough. The large downward pressure exerted onto a wafer during typical CMP polishing may damage fragile low-k dielectrics.

One approach to removing copper material from a substrate surface using CMP is called "overpolishing" the substrate. Overpolishing of some materials can result, however, in the formation of topographical defects, such as concavities or depressions in features, referred to as dishing. For example, an oxidizer can continue to etch electrically conductive material, for example, copper, during static periods when mechanical polishing is not being performed but the substrate surface remains in contact with the polishing slurry. This can occur, for example, upon completion of CMP but prior to removal of the substrate surface from contact with the slurry. As a consequence, unwanted static etching of the metallic features of the polished surface can occur, resulting in dishing. Dishing typically results in a height differential between the dielectric oxide layer and metalization features. Dishing is defined as removal of metal from the interconnect below the top level of the barrier layer. Dishing causes an increase in the electrical resistance of a copper interconnect because the conductor is thinner than it was designed to be. Increased resistivity can lead to overheating that causes the semiconductor device to fail.

Another problem of CMP processes is excessive removal of material from a wafer. The excessive removal of metal and barrier materials from a patterned substrate using slurry-based CMP is called erosion. Erosion typically manifests itself as a height differential between the height of a dielectric oxide layer in an open field region and its height in an array of metalization features. Erosion can lead to a non-planar topography across the wafer that can cause short circuits to form in subsequently deposited metal layers.

Additional problems of CMP include scratching of fine-lined metal in dielectric features by the agglomerations of abrasive particles. Scratching results in damage to interconnects and yield losses. A conglomerate of particles and gels can be removed from the slurries using point of use filtration prior to substrate polishing; however, plugging of the filters requires interruption of the process for filtrate removal, which is expensive and results in lower production. Conglomerate slurry particles also plug the surface of the polishing pad, and polishing pads must be periodically reconditioned in a non-value added step called dressing.

It is well-known in the art that CMP of copper is conducted by first oxidizing copper metal to an oxidized form of copper. The oxidized copper is then removed by exposing it to an electrolyte that dissolves the oxide material and by rubbing. Selectivity between the peak and valley of the surface may be achieved by the mechanical force exerted between the rotating wafer and the polishing pad to remove the oxide or protective layer. This method requires either large shear force and/or the presence of abrasives in order to achieve a reasonable removal rate, which may result in damage to the wafer, scratches, oxide erosion and copper dishing.

By planing metal-plated patterned surfaces down to an upper dielectric surface, only the portion of the material desired for conductive interconnects or for insulators remains. CMP is a process that uses a mixture of abrasives and pads to polish the surface of the integrated circuit. Unfortunately, CMP polishing techniques are difficult to control; the endpoint can be difficult to detect. Also, CMP materials and equipment are expensive. The high equipment cost, waste handling cost, and low throughput contribute to the overall expense of CMP. Also, with the introduction of low-k dielectrics into chip production, modification of traditional CMP processes is required, as current methods result in cracking and the lamination of most dielectric materials, which have a low compression strength and are fragile.

Other methods of planarization involve chemical etching techniques or electrochemical (electrolytic) etching techniques, such as electropolishing. Electrochemical planarization is an attractive alternative to CMP because it does not impart significant mechanical stresses to the workpiece, and consequently does not significantly reduce the integrity of the devices. Furthermore, electrochemical planarization is less likely to cause dishing, oxide erosion, and oxide loss of the dielectric layer. These techniques are low-cost methods, relative to CMP. Lower capital cost, easier waste handling, and much higher processing rates make them desirable alternatives to CMP. Electropolishing is a method of polishing metal surfaces by applying an electric current through an electrolytic bath, and removing metal via electrolytic dissolution. Electropolishing may be viewed as the reverse of electroplating. For example, U.S. Pat. No. 5,096,550, issued Mar. 17, 1992, to Mayer et al., teaches an electropolishing apparatus having a vessel filled with electrolytic solution, a cathode mounted in the vessel, and an anode containing the semiconductor substrate positioned in the vessel. U.S. Pat. No. 5,256,565, issued Oct. 26, 1993, to Bernhardt et al., teaches a method of forming a planarized metal interconnect by connecting a substrate containing a metal-filled trench or via to the anode of a DC voltage source, placing the substrate in an electrolyte, and flowing DC current through the substrate. United States Patent Application Publication No. 2004/0134793, published Jul. 15, 2004, by Uzoh et al., teaches a method and an apparatus for electroetching metal from a substrate surface by applying a voltage between an electrode and a substrate and continuously applying an etching solution to the substrate surface as a plurality of rollers are rotated.

A problem arises during the electropolishing of surfaces in which a large number of low aspect-ratio (larger width than depth) features exist. Wide interconnect lines (trenches cut in a dielectric layer for a damascene process) and contact/bond pads often have low aspect ratios. Low aspect ratio features generally require the plating of an overburden layer slightly thicker than the thickness of the damascene layer so that the feature is completely filled after planarization. The metal fill profile above these features exhibits large recesses having profiles that resemble the original low aspect-ratio feature. The metal processes used to deposit the metal, which are substantially conformal over such low aspect-ratio features, are typically not continued to a point that would geometrically "close" such recesses, because to do so would require depositing a very thick metal layer. Depositing a thick metal layer would be uneconomical due to necessary removal of the large excess of metal at a later stage. Conventional electropolishing techniques can planarize a surface in which the recessed feature to be planarized is no more than perhaps three times as wide as it is deep. For features wider than these, the rate of removal is essentially uniform everywhere. When the metal layer is electropolished to the dielectric surface, recesses over low aspect ratio features are propagated and expanded to produce recesses that span the width of these features, leaving effectively little or no metal in the metal pad regions. Obviously this is an unacceptable result.

The term "electrochemical mechanical polishing" (ECMP) has been used in the prior art to refer to a group of various techniques for planarizing a metal layer on a semiconductor substrate. ECMP generally includes the application of a combination of electrochemical activity and mechanical activity to remove material from a substrate surface. For example, U.S. Pat. No. 6,811,680, issued Nov. 2, 2004, to Chen et al., teaches a method and an apparatus for planarizing a metal layer on a semiconductor substrate using ECMP including forming a passivation layer, and then sequentially conducting physical pad-polishing and electrochemical treatment in separate pad-polishing and electrochemical processing stations. U.S. Pat. No. 6,841,057, issued Jan. 11, 2005, to Wadensweiler et al., teaches a method and apparatus using ECMP for planarizing a metal layer of a substrate surface by holding the substrate face down in a polishing head and pressing the substrate against a conductive polishing pad while flowing electrolyte between the conductive polishing pad and an electrode, avoiding the use of conventional bias application such as wafer-edge contacts. Similarly, U.S. Pat. No. 6,776,693, issued Aug. 17, 2004, to Duboust et al. teaches a method and an apparatus in which a polishing head contains a cathode and a conductive polishing pad, and a face-up anodic substrate surface is pressed against the conductive polishing pad during electrochemical removal of material from the substrate. U.S. Pat. No. 6,821,409, issued Nov. 23, 2004, to Basol et al., teaches a method and an apparatus for planarizing metal on a substrate surface by using an electrolytic solution in combination with contacting, sweeping and/or polishing of the surface with an abrasive mask plate. Channels in the mask bring the electrolytic solution into contact with the substrate surface during electrochemical dissolution. U.S. Pat. No. 6,739,951, issued May 25, 2004, to Sun et al., together with U.S. Pat. No. 6,379,223, issued Apr. 30, 2002, to Sun et al., teach a method and an apparatus using ECMP that provide a non-abrasive polishing pad with an oxidizer-free non-abrasive electrolyte and apply a time-varying anodic potential to the workpiece surface for dissolving the metal while simultaneously applying mechanical polishing action to the surface. The polishing pad functions as a cathode. U.S. Pat. No. 6,066,030, issued May 23, 2000, to Uzoh, teaches a method and an apparatus for planarizing metal on a substrate surface by conducting electroetching followed by CMP using a single platform. U.S. Pat. No. 5,807,165, issued Sep. 15, 1998, to Uzoh et al., teaches a method of electrochemical mechanical planarization in which the entire surface of a substrate wafer is pressed against a polishing pad supported by a cathodic platen. United States Patent Application Publication No. 2004/0195111, published Oct. 7, 2004, by Talieh et al., teaches an apparatus useful for electroetching and polishing metal from a substrate surface that includes a conductive cathodic pad and conductive pins located in the pad to make electrical connection between an anode and the substrate surface. U.S. Pat. No. 6,790,130, issued Sep. 14, 2004, to Doan et al., teaches a ECMP method in which a conductive polishing pad serves as an electrode during simultaneous electrochemical and physical polishing operations. U.S. Pat. No. 6,706,158, issued Mar. 16, 2004, to Sharan et al., teaches a ECMP apparatus in which a conductive polishing pad serves as cathode during electrochemical and physical polishing operations.

There exists a need in the semiconductor industry to polish thin metal films and fine copper interconnect lines inlaid on a patterned substrate that includes dielectric and barrier layer materials. The metal films and interconnect lines and patterns revealed by polishing should be substantially free from scratches, dishing and erosion. The techniques for polishing fine copper interconnect lines and metal films on a patterned substrate should yield smooth surfaces, have a high removal rate, and applied a low pressure to substrate surfaces. It is further desirable to be able to control the removal rate of the metal from the substrate without changing pressure or rotational rate of a polishing pad or substrate. What is needed therefore is improved electropolishing technology for planarizing conductive layers having varying topography, particularly metal layers having both recesses and raised regions and having both very narrow (submicron) and very wide (on the order of 100 µm) widths.

SUMMARY OF THE INVENTION

The invention helps to solve some of the problems mentioned above by providing systems and methods for pad-assisted electropolishing of integrated circuit substrates. Embodiments in accordance with the invention utilize novel electrical edge-contact techniques that allow planarization of the entire surface of the substrate, including extreme peripheral areas at the outside edge of wafer. Pad-assisted electropolishing in accordance with the invention avoids dishing, erosion, and scratching or other damage to metal and dielectric surfaces.

A first basic embodiment of methods in accordance with the invention includes conducting electrochemical dissolution of metal (e.g., copper) of a substrate face of semiconductor substrate, and conducting non-electrochemical mechanical buffing of the same substrate face. Preferably, electrochemical (anodic) dissolution at a first portion of a substrate face and physical buffing at a second portion of the same substrate face occur simultaneously. A substrate wafer is electrically connected to a positive terminal of a power supply so that the substrate face containing metal functions as an anode during anodic dissolution of metal at the first portion. In preferred embodiments, no electrical contact structures make physical contact with the substrate face being planararized. Electrical contact to a substrate wafer is effected, for example, by means of one or more side-edge contacts or backside contacts. An electropolishing head functions as a cathode and is located proximate to the first portion of the substrate face to create a thin gap. Electropolishing liquid fills the thin gap. In some embodiments, electropolishing liquid is substantially absent from the rest of the substrate face including the second portion being physically buffed.

A second basic embodiment of methods in accordance with the invention includes immersing the substrate wafer in an electropolishing bath, in which anodic dissolution is conducted at a first portion of the substrate wafer using an electropolishing head that forms a thin liquid layer, and non-electrochemical mechanical buffing is conducted at a second portion.

A third basic embodiment in accordance with the invention includes immersing a cathode and an anodic substrate in an electropolishing bath without using an electropolishing head to create a thin liquid layer.

Methods in accordance with the invention allow use of a simple, low-cost isotropic wet-etching technique after pad-assisted electropolishing that selectively removes remains of copper and typically is stopped at a barrier/etch-stop layer. A feature of embodiments of methods in accordance with the invention is the capability of planarizing the entire surface of the substrate face, including extreme peripheral portions of the substrate face contiguous to the side edges of the substrate.

An apparatus includes structures for anodizing at least a first portion of a substrate wafer and providing electropolishing liquid to the first portion to generate anodic dissolution of metal at the first portion. An apparatus further includes structures for non-electrochemical mechanical buffing of a substrate face. Preferably, an apparatus enables mechanical buffing at a second portion of a substrate face at the same time that anodic dissolution (electropolishing) occurs at the first portion of the substrate face. An apparatus in accordance with the invention is useful for both pad-assisted electropolishing and for processes that uniformly remove material from a substrate surface, such as isotropic wet etching.

Thus, methods and apparatus in accordance with the invention allow substantial uncoupling of physical buffing processes from electrochemical processes being conducted on a substrate wafer.

Other features, characteristics and advantages of embodiments in accordance with the invention will become apparent in the detailed description below.

BRIEF DESCRIPTION OF THE DRAWINGS

A more complete understanding of the invention may be obtained by reference to the drawings, in which:

FIG. 22 contains a generalized process flow sheet of an alternative method in accordance with the invention for planarizing a substrate surface having a metal layer, in which a cathode, a buffing pad and an anodic substrate are immersed in an electropolishing bath.

DESCRIPTION OF THE INVENTION

Figure 1:
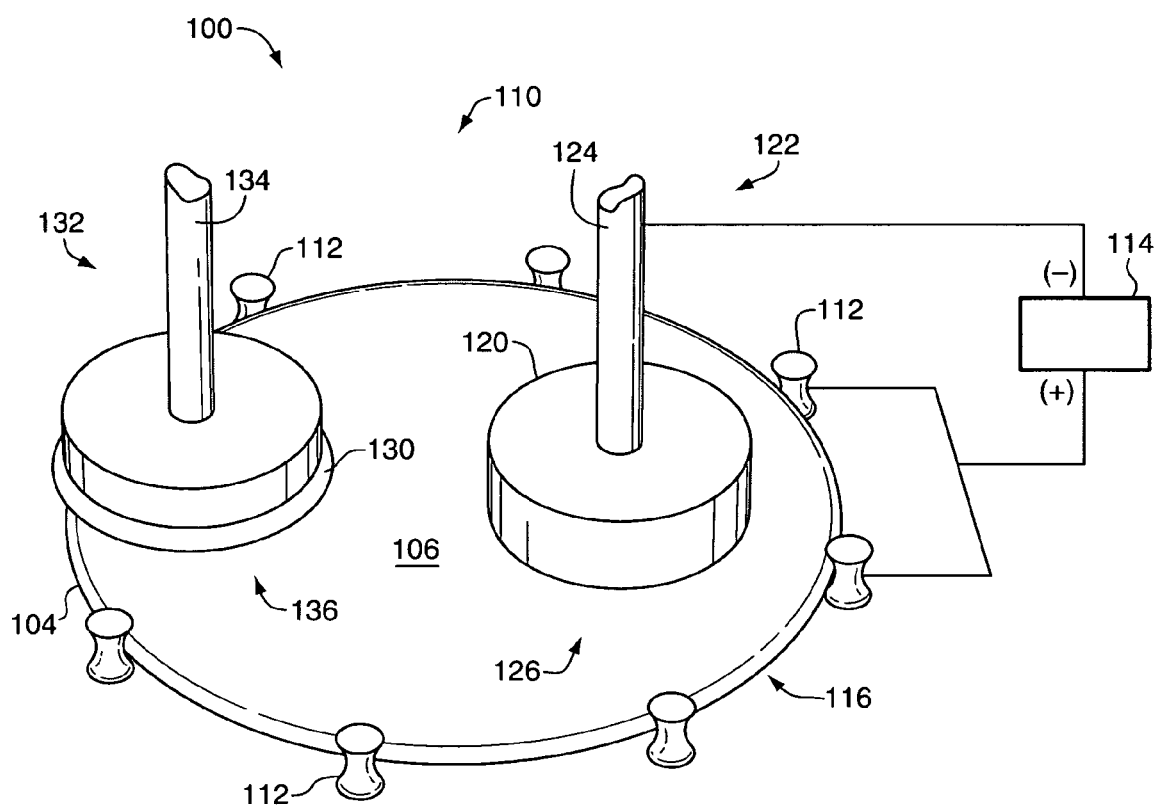
FIG. 1 depicts schematically a perspective view of a circular substrate wafer being planarized with an apparatus having an electropolishing head, a buffing pad, and side-edge electrical contacts in accordance with the invention.

The invention is described herein with reference to FIGS. 1-22. It should be understood that the structures and systems depicted schematically in FIGS. 1-11, 13-21 serve explanatory purposes and are not precise depictions of actual structures and systems in accordance with the invention. For example, the depiction of power supplies and fluid handling in the figures below likely is different from hardware in actual embodiments. Furthermore, the embodiments described herein are exemplary and are not intended to limit the scope of the invention, which is defined in the claims below. For the sake of clarity, parts and elements of various embodiments having similar structure and function are identified using the same reference numerals in the figures below.

In this specification, terms of orientation, such as "face-up", "above", "below", "up", "down", "top", "bottom", and "vertical" used to describe embodiments relate to the relative directions in FIGS. 1-11, and 13-21, in which a substrate wafer defines a substantially horizontal plane. It is understood, however, that the spatial orientation of substrates and apparatuses in embodiments in accordance with the invention are not confined to those depicted in the drawings.

The term "liquid" is used broadly herein to include not only liquids, but also combinations of liquids and solids, such as slurries and suspensions. The term "buffing medium" herein is used broadly to include a liquid, a suspension or any other medium used with a buffing pad during mechanical polishing (buffing) of a substrate. In some embodiments, the same medium (e.g., liquid, slurry, suspension) is used as both "electropolishing liquid" and buffing medium. The terms "nonabrasive", "nonabrasive pad", "nonabrasive medium" and similar terms are relative terms used to describe objects and processes that do not scratch or otherwise damage metal and dielectric material commonly used in integrated circuits.

The term "anodizing" herein means establishing on a conductive material an electrical bias that is positive relative to some reference material, such as electropolishing liquid or a negatively-biased cathode. Similarly, the term "cathodizing" means establishing on a conductive material an electrical bias that is negative relative to some reference material, such as electropolishing liquid or a positively-biased conductive material (e.g., an anode). The terms "anodic dissolution", "electrochemical dissolution" and related terms are used synonymously in this specification. The terms "unbiased", "electrically unbiased" and related terms imply that there is substantially no electrical or ionic current. The term "nonconductive" means electronically nonconductive or ionically nonconductive or both.

The term "nominal area" refers to the area of surface that would be measured if the surface were smooth, without embedded features, raised areas, and other area-increasing topography.

The term "first portion" and similar terms used in relation to a substrate face generally refers to a portion of the substrate face at which electrochemical dissolution is occurring at a particular point in time. The term "second portion" and similar terms used in relation to a substrate face generally refer to a portion of the substrate face at which mechanical buffing occurs at a particular point in time without significant electrochemical action.

The term "simultaneous" is used in specification to indicate that anodic dissolution of metal occurs at a first portion of the substrate wafer while mechanical buffing (without significant electrochemical action) of a second portion of the same substrate wafer occurs at the same time. The term "simultaneous" and related terms means that there is at least some overlap of the time periods in which one or more processes are occurring. It does not mean that whenever a first set of processes is occurring (e.g., processes related to anodic dissolution) that a second set of processes (e.g., mechanical buffing) must occur during the whole time that the first set of processes is occurring. The term "concomitantly" is used more broadly to designate electrochemical dissolution and physical buffing that occur either simultaneously or in quick succession from each other, usually cyclically, but do not necessarily simultaneously with each other.

A planarization process generally involves planarization of a substantial part of the substrate face, typically virtually all of the substrate face. Thus, the location of a first portion and the location of a second portion change during a planarization process so that electrochemical dissolution and physical buffing (non-electrochemical) occur during some finite time period at all locations of the substrate face. Electrochemical dissolution at a first portion and physical buffing (non-electrochemical) at a second portion occur at least concomitantly, typically simultaneously. At a particular, given location of the substrate face, however, electrochemical dissolution and physical buffing (non-electrochemical) occur at different times. For example, the location of a first portion changes with time as an electropolishing head moves (is translated) with respect to the substrate wafer, or as the substrate wafer moves (e.g., rotates) relative to the location of an electropolishing head or other cathode, or by a combination of both. Similarly, the location of a second portion where physical buffing occurs changes with time as a buffing pad moves (translates) with respect to the substrate wafer, or as the substrate wafer moves (e.g., rotates) relative to the location of a buffing pad, or by a combination of both.

The terms "move", "movement" and related terms are used in their normal sense to refer to several kinds of movement. In one sense, the terms refer to small reciprocating movements of a buffing pad when the general location of the pad relative to a substrate wafer does not change. The terms also refer to gross movements of various elements of an apparatus, such as the movements of a buffing pad, an electropolishing head, and a wafer holder. For example, at times during a planarization process, a buffing pad translates vertically (perpendicularly) toward a substrate face to make physical contact with the substrate. Similarly, at times during a planarization process in some embodiments, an electropolishing head moves (translates) perpendicularly towards a substrate face to form a thin gap. Also, for example, at times during a planarization process in some embodiments, a buffing pad moves (is translated) horizontally (parallel) to a substrate face, thereby moving the location of a buffing portion. The meaning of the terms "move", "movement" and related terms is clear from the particular context in which they are used. For clarity, terms such as "reciprocate" and "translate" are sometimes used to specify the kind of movement being described.

In embodiments in which the substrate is rotated, the locations of the first electrochemical portion and one or more non-electrochemical buffing portions are continuously changing as the substrate rotates.

FIG. 1 depicts schematically a perspective view 100 of a circular substrate wafer 104 being planarized using an apparatus and a method in accordance with the invention. Substrate wafer 104 includes a substrate face 106 having a metal layer to be planarized. An apparatus 110 includes edge confinement cylinders 112 for aligning and confining substrate wafer 104. Appropriate rotary electrical contacts to edge confinement cylinders enable edge confinement cylinders to function as edge electrical contact structures 112. Confinement cylinders 112 either actively rotate (driven by a motor) to induce rotation, or are slaves to the general work piece rotation imposed by some other means (not shown). Confinement cylinders 112 may have an axially varying diameter, preferably with the top and bottom axial regions having a larger diameter than the center axial region as shown. In some embodiments, the work piece is supported by a platen or other support mechanism, which may comprise electrical contacts for anodizing the work piece. One or more of electrical edge contact cylinders 112 provide electrical contact between the positive terminal of a power supply 114 and the side edge 116 of substrate wafer 104. Apparatus 110 also comprises a cathodic electropolishing head 120. Electropolishing head 120 is integrated into a head assembly 122. Head assembly 122 includes head shaft 124 connected functionally to electropolishing head 120 for moving (translating) electropolishing head 120 vertically and horizontally with respect to the plane of substrate face 106, as well as for rotating electropolishing head 120. Electropolishing head 120 is electrically connected through head assembly 122 with the negative terminal of power supply 114. During planarizing operations in accordance with the invention, electropolishing head 120 is located in a lowered position proximate to substrate face 106, but preferably not physically touching substrate face 106. Electropolishing head 120 thereby forms a thin gap between electropolishing head 120 and substrate face 106 corresponding to a first portion 126 of the substrate face. As depicted in FIG. 1, first portion 126 has an area for contacting substrate face 106 less than the nominal surface area of substrate face 106. To conduct electropolishing processes at first portion 126, electropolishing liquid comprising an electrolytic solution is provided to form a thin liquid layer in the thin gap, and power supply 114 provides electric current in the electropolishing liquid. As a result, anodic dissolution of metal occurs at portion 126 of substrate face 106. Apparatus 110 further comprises a buffing pad 130 in a pad assembly 132. Pad assembly 132 includes pad shaft 134 connected functionally to buffing pad 130 for translating buffing pad 130 vertically and horizontally with respect to the plane of substrate face 106, as well as for rotating buffing pad 130. During planarizing operations in accordance with the invention, buffing pad 130 is located in a lowered position in contact with a second portion 136 of substrate face 106. As depicted in FIG. 1, second portion 136 has an area less than the nominal surface area of substrate face 106. Pad assembly 132 including buffing pad 130 typically is substantially electrically unbiased.

Also, in some embodiments, buffing portion 136 of substrate face 106 is substantially electrically unbiased. As shown in FIG. 1, pad assembly typically is not connected to a power supply. Also in some embodiments, there are no electrical connections to substrate wafer 104 proximate to second portion 136. Co-owned and co-pending priority U.S. patent application Ser. No. 10/739,822, filed Dec. 17, 2003, by Mayer et al., having the title "Method for Planar Electroplating", which is incorporated by reference, teaches an apparatus similar to apparatus 110 in which electrical-contact edge-confinement cylinders provide electrical contact at the side edge of a wafer, and in which an electrochemical treating head is used for electroplating metal on the substrate surface, while a buffing pad selectively removes an activating film.

Typically, physical buffing processes at second portion 136 and electropolishing processes in the electrochemical region corresponding to first portion 126 are conducted simultaneously. Therefore, the sum area of electrochemically-active first portion 126 and the physical buffing area of second portion 136 usually is less than the nominal surface area of substrate face 106.

Figure 2:
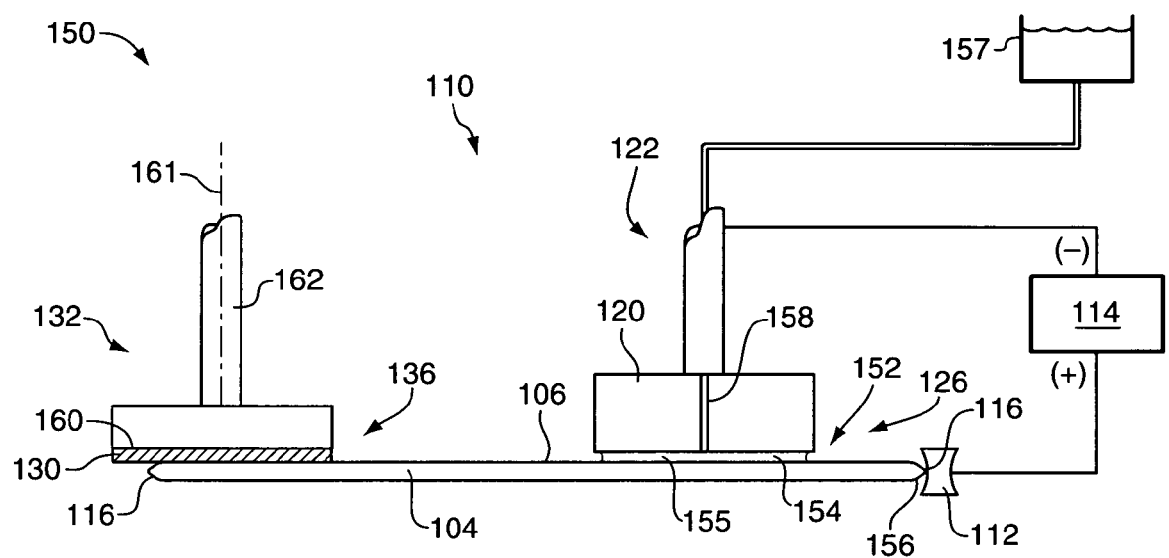
FIG. 2 depicts schematically a cross-sectional view of the apparatus of FIG. 1 during planarization of a wafer in accordance with the invention.

FIG. 2 depicts schematically a cross-sectional view 150 of apparatus 110 during planarization of wafer 104 in accordance with the invention. FIG. 2 shows cathodic electropolishing head 120 located above first portion 126 of substrate face 106 to form a thin gap 152. Thin liquid layer 154 containing electrolytic electropolishing liquid 155 is located in thin gap 152. A negative terminal of power supply 114 is electrically connected through head assembly 122 to electropolishing head 120. A positive terminal of power supply 114 is connected to an electrical-contact edge-confinement cylinder 112 proximate to first portion 126. To effect electrical contact between power supply 114 and substrate wafer 104, side edge 116 and bevel edge 156 of substrate wafer 104 comprise a metal layer. It is understood that other embodiments in accordance with the invention comprise electrical contact structures known in the art that are different from edge-contact cylinders 112 depicted in FIGS. 1 and 2.

As depicted in FIG. 2, apparatus 110 further comprises liquid source 157 for supplying electropolishing liquid 155 of thin liquid layer 154. Liquid source 157 is fluidically connected through head assembly 122 to a liquid flow channel 158 in electropolishing head 120. Electropolishing liquid flows through channel 158 to fill thin gap 152 to form thin liquid layer 154. Co-owned and co-pending U.S. patent application Ser. No. 10/609,518, filed Jun. 30, 2003, by Mayer et al., having the title "Liquid Treatment Using Thin Liquid Layer", which is incorporated by reference, teaches a treating head suitable for electropolishing processes in accordance with the invention. application Ser. No. 10/609,518 teaches treating heads for creating thin gaps with various shapes, and it teaches several alternatives of manifold systems in a treating head for controlling fluid flow through the treating head and for distributing fluid in a thin gap.

FIG. 2 also depicts buffing pad 130 of pad assembly 132 in physical contact with second portion 136 of substrate face 106. Pad 130 is attached to a substantially flat support member 160, typical using a strong adhesive. Preferably, pad 130 is relatively nonabrasive. The pad is, for example, a commercially available type, such as IC1000 from Rodel company. Pad assembly 132 including support member 160 typically includes appropriate hardware allowing the pad and support to be gimbaled about the axial center 161 so the surface of the pad naturally assumes the plane of a work piece (e.g., substrate face 106) when it is engaged. The pad assembly includes a drive shaft 162, which optionally rotates the assembly, translates it up and down, towards or away from the work piece, and translates it horizontally to and from the center of the work piece. Drive shaft 162 is attached to appropriate motors and other mechanistic hardware to enable such movement. Pad assembly 132 is also connected to a pneumatic or other type mechanism used to control the pressure that the pad applies to the surface as it rubs the wafer and performs work. For simplicity, examples of such mechanisms, known in the various trades of engineering, are not shown. Lubricants, abrasive slurries and other materials useful in pad rubbing processes are introduced using conventional means through the pad itself, or from spray nozzles onto the wafer, whereby pad rotation brings the lubricant or other material under the pad. In some embodiments, electrolytic electropolishing liquid 155 used for a electrochemical dissolution at first portion 126 is also used as a rubbing lubricant or slurry for non-electrochemical physical buffing at second portion 136. An advantage of using a slurry in some embodiments is that a slurry provides some medium-range compliance that is typically not provided by a relatively rigid buffing pad. In other words, a slurry tends to fill in microscopic gaps in between a buffing pad and the surface of a substrate face. In some embodiments, no electrical contact structures provide an electrical bias to or are located proximate to second portion 136 of substrate wafer 104. Also, buffing pad 130 and pad assembly 132 typically are electrically unbiased. As depicted in FIG. 2, a part of buffing pad 130 extends radially outward from side edge 116 contiguous to second portion 136. Preferably, pad assembly 132 is capable of pressing a buffing pad 130 against substrate face 106 to expel substantially electropolishing liquid away from said second portion 136. It is understood, however, that at least some small amount of liquid or slightly abrasive slurry typically is present at second portion 136 to effect physical buffing of second portion 136 with minimal applied pressure.

An advantage of apparatus 110 is a capability of planarizing the entire surface area of substrate face 106, even the extreme peripheral areas contiguous to side edge 116 and to bevel edge 156. This is accomplished practically through a combination of a capability of moving (translating or reciprocating) buffing pad 130 beyond the actual outer side edge 116 of substrate wafer 104, and of translating electropolishing head radially outwards until thin liquid layer 154 is contiguous with bevel edge 156. In some embodiments in accordance with the invention, substrate wafer 106 rotates either continuously or intermittently during planarizing operations. Therefore, buffing pad 130 is movable radially outwards to outer side edge 116 or beyond at a location in between neighboring electrical contact cylinders 112, as shown in FIG. 1. Similarly, electropolishing head 120 can be positioned close to side edge 116 of first portion 126 without encountering interference from electrical edge contact structure 112. Alternatively, for example, one or several electrical edge contact cylinders 112 in the vicinity of second portion 136 being physically buffed are physically disengaged from substrate wafer 104, thereby allowing buffing pad 130 to move up to and beyond side edge 116. For example, co-owned U.S. Pat. No. 6,537,416, issued Mar. 25, 2003, to Mayer et al., which is hereby incorporated by reference, teaches a vacuum chuck for holding and supporting a semiconductor wafer, which chuck includes edge alignment- and confinement-members that contact the edge of a wafer. The contact members are pneumatically controlled by a plurality of pneumatic actuators to engage or disengage from the side edge of a wafer. With sufficient total number of edge-contact edge-confinement cylinders 112 in embodiments of the current invention, one or several edge confinement cylinders optionally are disengaged from substrate wafer 104 without jeopardizing the alignment and confinement of substrate wafer 104.

A feature of a method in accordance with the invention is that the same apparatus used for pad-assisted electropolishing of a substrate is useful for conducting conventional non-electrolytic chemical processes (e.g., wet etching techniques) for removing material from a substrate face after completing electropolishing and buffing processes.

Figure 3:
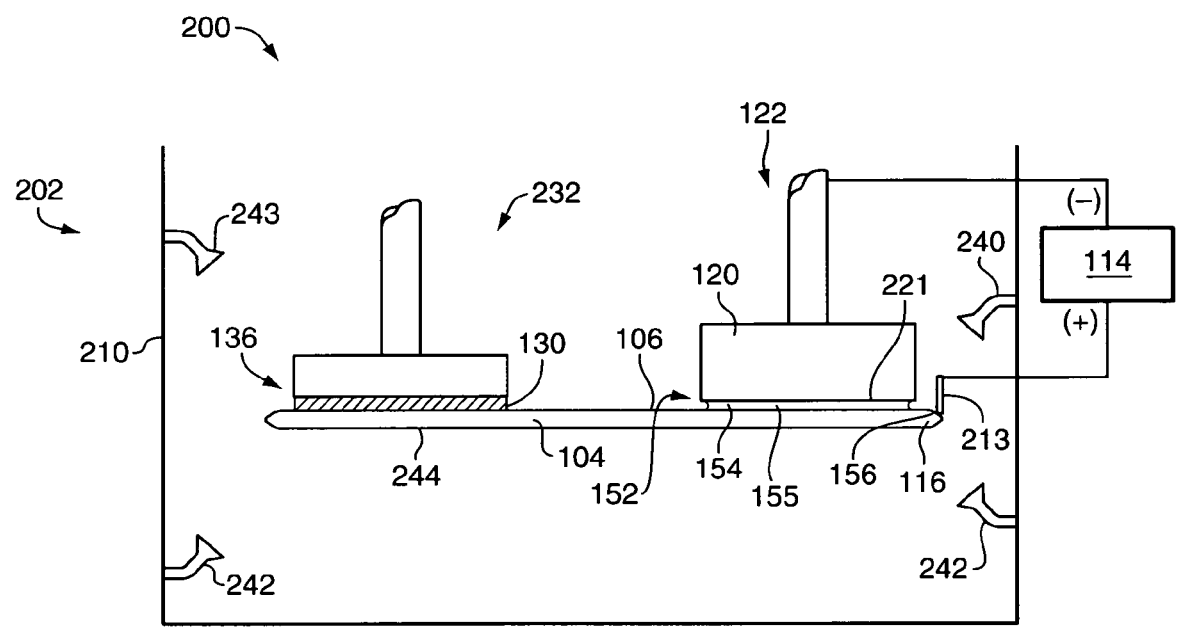
FIG. 3 depicts schematically a cross-sectional view of an apparatus during planarization of a wafer in accordance with the invention.

FIG. 3 depicts schematically a cross-sectional view 200 of apparatus 202 during planarization of a wafer 104 in accordance with the invention. Substrate wafer 104 having substrate face 106 is located in processing containment chamber 210 of apparatus 202. Apparatus 202 comprises one or more of a front-side electrical contact structure 213, which electrically connects the positive terminal of power supply 114 to metal-coated substrate wafer 104. Typically, electrical contact structure 213 makes electrical contact to wafer 104 at the top side of bevel edge 156. A conventional electrical contact is suitable for use as front-side electrical contact structure 213, such as, a pin-type structure, a roller-pin, or a brush. At least one electrical edge-contact structure 213 is in physical contact with edge 116, 156 of substrate wafer 104. Apparatus 202 further comprises cathodic electropolishing head 120 having lower treating surface 221, and which is part of head assembly 122. Lower treating surface 221 is located slightly above a first portion 126 of substrate face 106, thereby forming a thin gap 152 at first portion 126 between electropolishing head 120 and substrate face 106. A thin liquid layer 154 of electropolishing liquid 155 is located in thin gap 152. Apparatus 202 further comprises a buffing pad 130, which is part of pad assembly 132. Buffing pad 130 and pad assembly 132 are not electrically biased. As depicted in FIG. 3, buffing pad 130 is located in physical contact with a second portion 136 of substrate face 106. Apparatus 202 further comprises one or more electropolishing-liquid-injection nozzles 240 for providing electropolishing liquid 155 to substrate 106, in particular into thin gap 152, to form thin liquid layer 154. Apparatus 202 further comprises one or more rinsing nozzles 242, 243 for directing ionized water or other cleaning fluid at substrate face 106 and wafer backside 244 before, during or after planarization processes. Optionally, a nozzle 243 is used for applying a lubricating or buffing medium to substrate face 106 for buffing processes using pad 130. Optionally, nozzles 240, 243 are useful for applying a passivating layer on substrate face 106 to assist in controlling the rate of electrochemical dissolution of metal on substrate 104.

In some embodiments, treating surface 221 of head 120 that creates a gap 152 and is wetted with the electropolishing electrolyte is non-porous, and comprises a material which is generally electrically conductive and not corroded at the cathodic potentials likely to be encountered during operation, and is chosen from those materials known in the art as substantially "inert", or "dimensionally stable" cathode (electrode) materials. Cathodic treating surface 221 optionally comprises the same material as the bulk material of head 120, or head 120 comprises different conducting material and is coated with an interfacial film of dimensionally stable material. Suitable materials for a chemically thermodynamically stable film include platinum, gold, ruthenium, iridium, and other noble metals and alloys.

In other embodiments, head 120 contains an electrode assembly, a porous membrane, and circulating electrolyte above the membrane. The exact configuration depends on the economics of the situation, driven largely by the nature of the electrochemical reaction occurring. It is understood that the exact orientation of apparatus structures and wafer substrate (with respect to Earth's gravity) is not particularly limiting. A wafer substrate (and corresponding apparatus structures) are optionally face-up, face-down, or at an angle, depending on the application requirements.

In general, both electropolishing head 120 and mechanical polishing (buffing) pad 130 are located and/or move with respect to the wafer center, allowing the wafer to undergo both electropolishing and pad-rubbing simultaneously but at separate locations on the wafer surface as the wafer rotates. Alternatively, the electropolishing head and a mechanical rubbing pad maintain a fixed relation as a group and move back and forth (translate) over the wafer surface. In this case, the active buffing area of pad 130 and the footprint area of electropolishing head 120 and corresponding area of thin gap 152 should be designed to minimize overall planarization time and thereby maximize global planarizing rates and throughput. For a 300 mm substrate wafer having a nominal surface area of approximately 707 cm$^2$, the buffing area of pad 130 is generally in a range of about from 100 cm$^2$ to 400 cm$^2$, and the surface area of treating surface 221 of electropolishing head 120 and the corresponding area of thin gap 152 are generally in a range of about from 100 cm$^2$ to 400 cm$^2$. The total working area of both the buffing pad and the electropolishing head is generally less than the total nominal surface area of the wafer surface. For example, the typical buffing area of circular pad 130 comprises about 300 cm$^2$, and the surface area of treating surface 221 of electropolishing head 120 and the corresponding area of thin gap 152 are about 300 cm$^2$.

As described in U.S. patent application Ser. No. 10/609,518, the reactor head of a thin film reactor is movable to close proximity (e.g., about 0.5 mm to 3 mm) to a wafer to create a thin gap 152. In accordance with this invention, electropolishing head 120 contains or actually functions as a cathode. An associated control system ensures that the head is precisely positioned in at least the z and theta (angular) positions with respect to the work piece surface to ensure that the head stays a fixed distance from the work piece surface.

After appropriate surface activations and pretreatments (optionally performed with electropolishing head 120 and buffing pad 130 in raised positions, not shown), electropolishing head 120 is lowered to form gap 152, which is then flooded with an appropriate electrolyte to perform electropolishing, as described herein.

Figure 4:
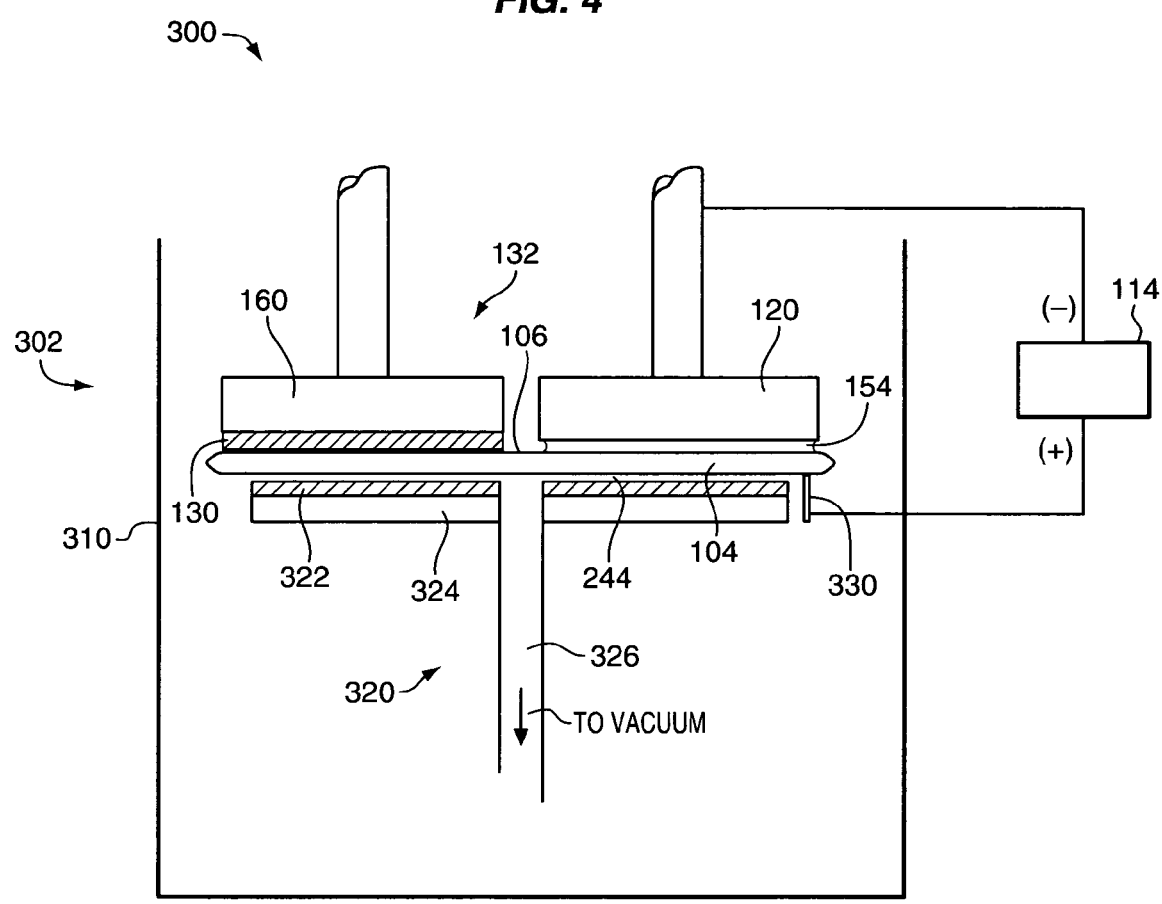
FIG. 4 depicts schematically a cross-sectional view of an apparatus providing a back-side electrical contact during planarization of a wafer in accordance with the invention.

Because a work piece, such as substrate wafer 104, is often thin and of limited mechanical strength (e.g., a silicon wafer), an optional supporting assembly is used in some embodiments. FIG. 4 depicts schematically a cross-sectional view 300 of apparatus 302 during planarization of a wafer 104 in accordance with the invention. Substrate wafer 104 having substrate face 106 is located in processing containment chamber 310 of apparatus 302. Apparatus 302 includes cathodic electropolishing head 120 forming a thin liquid layer 154 of electropolishing liquid on a first portion of substrate face 106, and buffing pad 130 in physical contact with a second portion of substrate face 106. Apparatus 302 further comprises supporting assembly 320. Like pad assembly 132, it can be rotated and translated vertically in containment chamber 310 to engage wafer 104. However, it typically does not need to be gimbaled, or have lateral movement or applied-pressure controlling mechanisms. A support pad 322 on support 324 of supporting assembly 320 is generally a soft, elastic or sponge-like material, capable of supporting the weight of the applied rubbing force globally, but responding to minor displacement as required. When support 324 is an off-center disk, the friction generated between supporting pad 322 and backside 244 of wafer 104 is less than that between wafer 104 and buffing pad 130. Alternatively, wafer 104 is supported on a flat platen substantially the same size as wafer 104, and the wafer is held while it rotates with the rotation of the platen as a whole. Friction between the back of the work piece and the supporting member is obtained either by using an appropriate material (e.g. various rubbers) or by applying a vacuum through vacuum conduit 326 (e.g., as in a conventional vacuum chuck).

As depicted in FIG. 4, apparatus 302 further comprises a back-side electrical contact structure 330, which electrically connects the positive terminal of power supply 114 to metal-coated (at least partially) backside 244 of substrate wafer 104. A conventional electrical contact is suitable for back-side electrical contact structure 330, such as, a pin-type structure, a roller-pin, or a brush.

Figure 5:
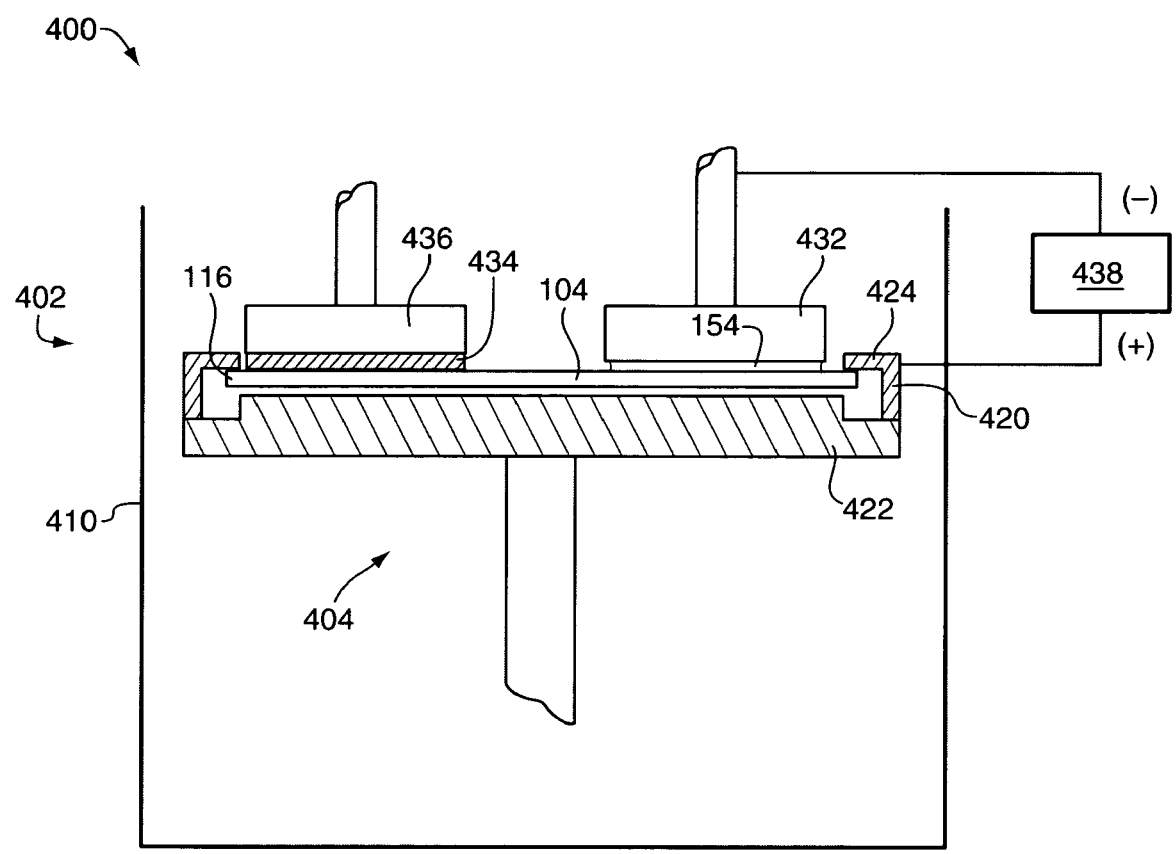
FIG. 5 depicts schematically a cross-sectional view of an apparatus comprising a clamshell-type wafer holder during planarization of a wafer in accordance with the invention.

FIG. 5 depicts schematically a cross-sectional view 400 of apparatus 402 during planarization of a wafer 104 in accordance with the invention. Apparatus 402 comprises a clam-shell-type wafer holder 404 located in containment chamber 410. Clamshell-type wafer holders are known in the art; for example, as disclosed in U.S. Pat. No. 6,800,187, issued Oct. 5, 2004, to Reid at al. Wafer holder 404 comprises a cup 420 and a cone 422. Cup 420 supports a wafer 104 via a lip 424. Lip 424 includes a compressible lip seal (not shown), which forms a fluid-tight seal when cone 422 engages wafer 104 against the lip seal. Wafer holder 404 encloses side edge 116 of wafer 104. The lip seal prevents electrolyte from contacting the backside of wafer 104. Apparatus 402 includes cathodic electropolishing head 432 forming a thin liquid layer 154 of electropolishing liquid on a first portion of substrate face 106, and buffing pad 434 on pad support 436 in physical contact with a second portion of substrate face 106. Electrical edge contacts located in wafer holder 404 effect electrical contact between side edge 116 of wafer 104 and a positive terminal of one or more power supplies 438.

Figure 6:
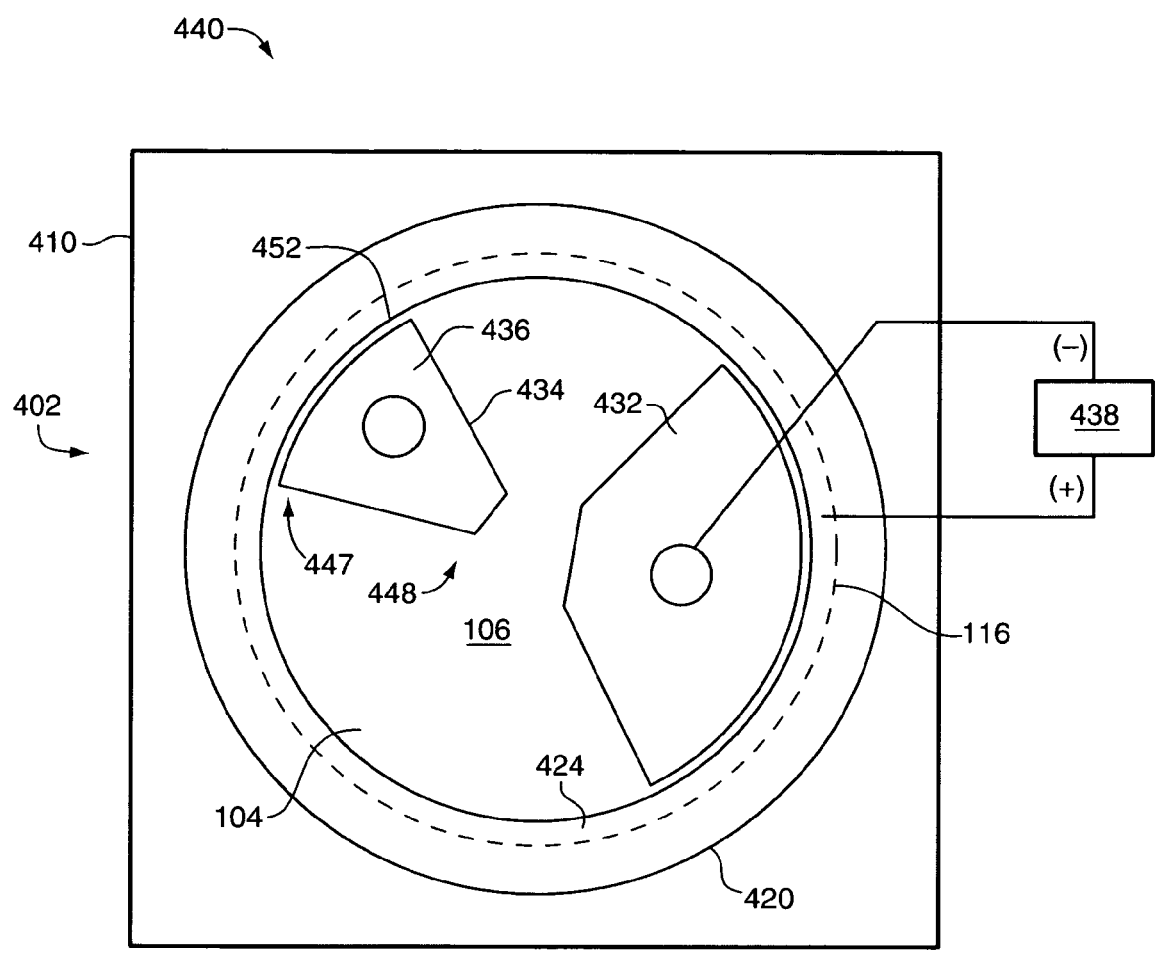
FIG. 6 depicts schematically a bottom-up sectional view of a cup of a clamshell wafer in which the side edge of a wafer substrate is enclosed under the lip of the cup.

FIG. 6 depicts schematically a top-down sectional view 440 of apparatus 402 with substrate wafer 104. Side edge 116 of wafer 104 is enclosed under lip 424 of cup 420. Dashed side edge 116 of wafer 104 in FIG. 6 also indicates a vertical wall of cup 420 defining lip 424. Electrical contacts (not shown) within cup 420 connect side edge 116 of wafer 104 with a positive terminal of power supplies 438. Cathodic electropolishing head 432 has a noncircular shape, which is useful for increasing the surface area available for electropolishing processes and for efficiently electropolishing peripheral areas of the first portion contiguous to inside edge 452 of lip 424. Buffing pad 434 and pad support 436 pad have an irregular shape, preferably wider at radially exterior portion 447 than at radially interior portion 448. Instead of being rotated during physical buffing processes, buffing pad 434 preferably is reciprocated back-and-forth in an orbital fashion with small movements (e.g., 0.1 mm to 5 mm amplitude) to effect efficient buffing of substrate face 106. In some embodiments, buffing pad 434 is reciprocated back-and-forth linearly in addition to or instead of orbital motion. Preferably, the shape of buffing pad 434 and pad support 436 are optimized to effect efficient buffing of substrate face 106 close to and in contact with inside edge 452 of lip 424.

Figure 7:
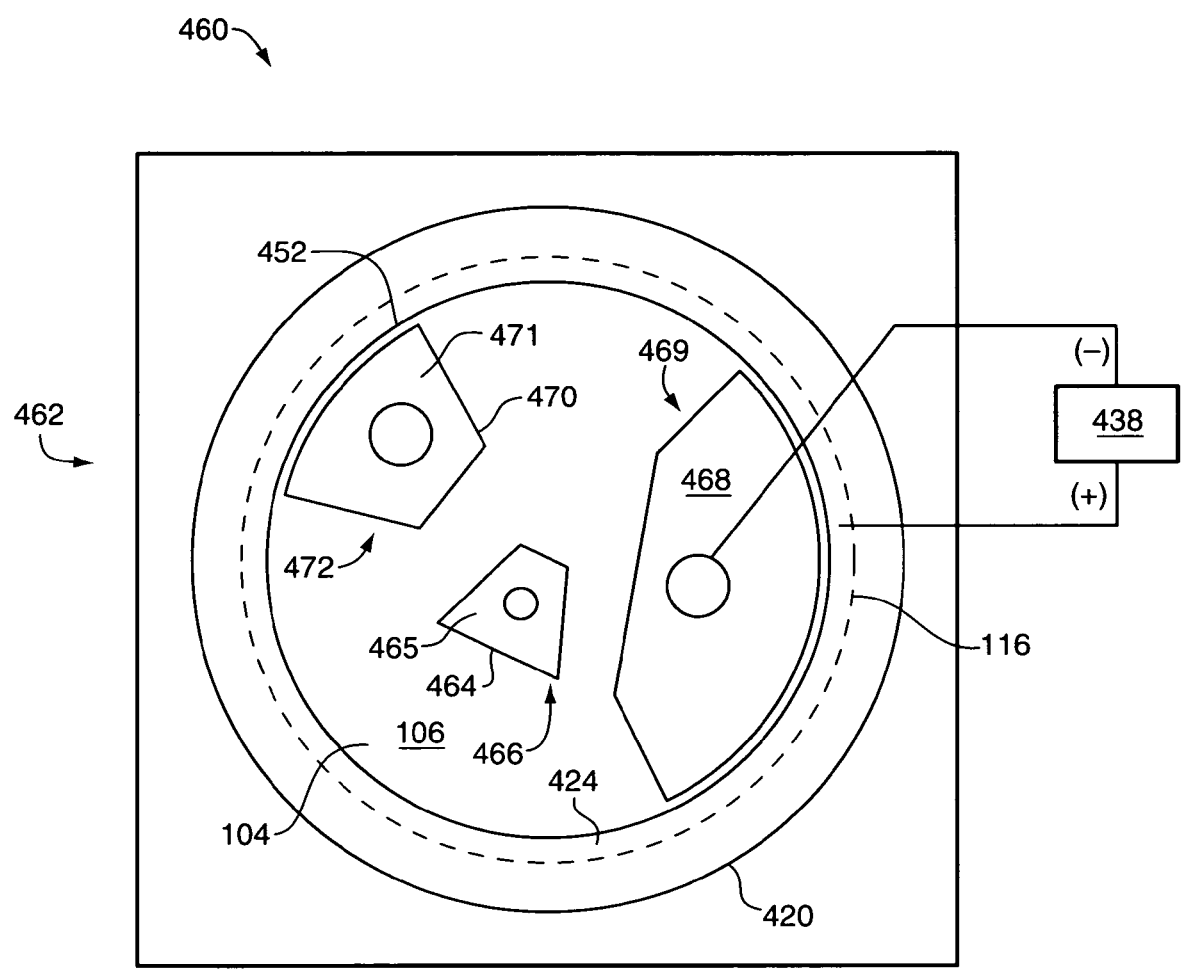
FIG. 7 depicts schematically a top-down sectional view of an apparatus in accordance with the invention having a second buffing pad in a second pad assembly for physically buffing a third portion of the substrate wafer.

FIG. 7 depicts schematically a top-down sectional view 460 of an apparatus 462 in accordance with the invention having a second buffing pad 464 in a second pad assembly 465 for physically buffing a third portion 466 of substrate wafer 104. Similar to apparatus 402 depicted in FIGS. 5 and 6, apparatus 462 comprises cathodic electropolishing head 468 located at a first portion 469 of substrate 104, and also comprises a first buffing pad 470 of first pad assembly 471 for physically buffing a second portion 472 of wafer 104. Side edge 116 of wafer 104 is enclosed under lip 424 of cup 420 of a wafer holder. Typically, first buffing pad 470 located above second portion 472 proximate to inside edge 452 of lip 424 is moved back-and-forth in small reciprocating movements (e.g., 0.1 mm to 5 mm amplitude) linearly, orbitally, rotationally or a combination thereof at some frequency (e.g., 10 to 2000 cycles/min). In embodiments in which wafer 104 is rotated, most of the work function of buffing pad 470 generally is obtained from the relatively fast rotational movement of substrate face 106 at its outer-radial peripheral areas contiguous to inside edge 452 of lip 424. When the substrate wafer is being rotated, the combination of the rotational motion of the wafer and the reciprocating motion of the buffing pad results in an average relative velocity of the buffing pad with respect to the wafer that is generally constant in magnitude, but which has a continuously changing direction. As a result, undesirable formation of a track or a groove under the buffing pad is avoided, and uniformity of planarization is enhanced.

Second buffing pad 464 is useful for physically buffing areas of substrate face 106 that are located in and around the center of wafer 104. When wafer 104 is rotated, the linear speed of rotation of areas of substrate face 106 at or near the center of wafer 104 is relatively slow compared to the linear speed of areas located further radially outward from the center. Therefore, only a relatively small amount of work is provided by rotation of the wafer near the center of wafer 104. Indeed, at the exact center of the wafer, zero work is provided by rotation of the wafer. On the other hand, by moving second buffing pad 464 quickly relative to substrate face 106, sufficient work is provided between buffing pad 464 and relatively slow-moving center portion 466. For example, reciprocation of buffing pad 464 in linear or orbital movements of 0.1 to 5 mm amplitude at a frequency of 10 to 2000 cycles per minute provides sufficient work for uniform buffing of third portion 466 and avoids formation of undesired tracks. Generally, second buffing pad 464 and second pad assembly 465 are electrically unbiased because, like first buffing pad 470 and pad assembly 471, they do not function as a cathode and do not serve to provide electrical bias to wafer 104. Preferably, electrochemical dissolution at first portion 469 and physical buffing at second portion 472 and at third portion 466 are conducted simultaneously. The total working area of buffing pads 464, 470 and of electropolishing head 468 is generally less than the total exposed nominal surface area of wafer surface 106. During pad-assisted electropolishing in accordance with the invention, second buffing pad 464 in second pad assembly 465 is moved (translated) one or several times away from the center region (portion 466 depicted in FIG. 7) of substrate face 106 and electropolishing head 468 is moved (translated) to cover the central region to conduct electrochemical dissolution at the central region. Alternatively, second pad assembly 465 stays in the same position relative to the center of the wafer, but an amplitude of its reciprocating motion is selected so that second buffing pad 464 alternately and cyclically covers and uncovers the center of the wafer.

Figure 8:
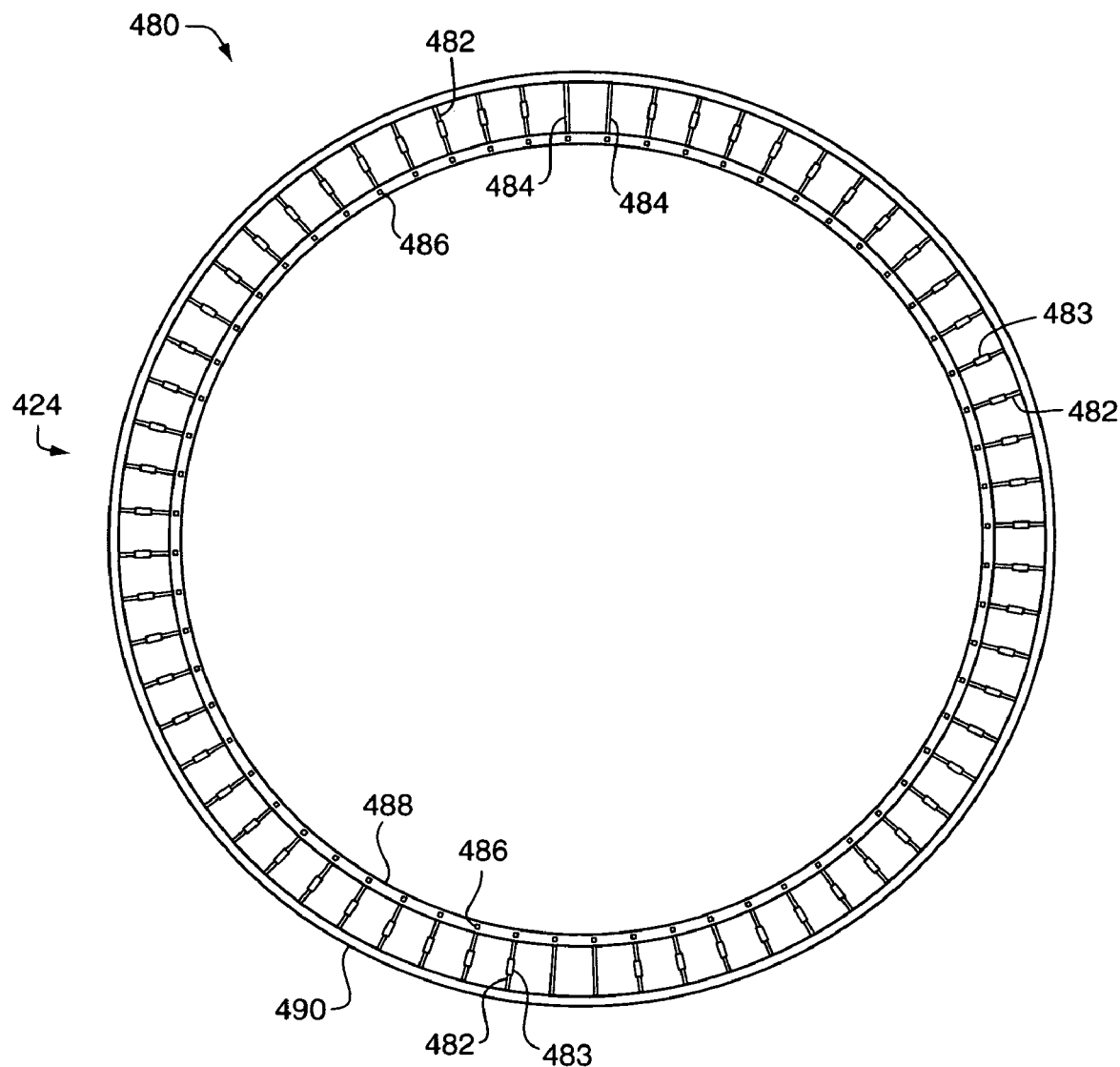
FIG. 8 depicts schematically a top view of a lip of a cup of a clam-shell type wafer holder in accordance with the invention, having a plurality of electrical contacts.

FIG. 8 shows a bottom-up view 480 of lip 424 of a cup of a clam-shell type wafer holder, as described in U.S. Pat. No. 6,755,946, issued Jun. 29, 2004, to Patton et al., which is hereby incorporated by reference. A first plurality of electrical contacts 482, each with an in-line resistor 483, are arranged about lip 424 of the wafer holder 404 (see FIG. 5) for providing electropolishing current to conductive metal-containing substrate face 106, each contact having its own individually regulated current source (that is, one of power supplies 438 of FIGS. 5-7). A second plurality of electrical contacts 484 is arranged about the lip for measuring electrical resistance or potential through metal on substrate face 106. Each of electrical contacts 482, 484 is associated with an embedded contact 486 embedded in lip seal 488. By varying the current supplied to individual electrical contacts 482, the current distribution across a conductive metal-containing substrate face is controlled. Electrical resistance or electrical potential measured by the second plurality of electrical contacts 484 provides data for feedback control of current supplied to the first plurality of electrical contacts 482. For example, such data are useful for endpoint detection and control. In some embodiments in accordance with the present invention, current is supplied to one or more electrical contacts proximate to the electrochemical portion of a substrate face, while substantially no current is supplied to the other electrical contacts. As a result, the substrate face at non-electrochemical portions of the wafer, for example, at the buffing portion, is electrically substantially unbiased with respect to the electropolishing liquid. Shunt bar 490 is used when electropolishing current is supplied to all of electrical contacts 482 via a single current source. As a practical matter, strong ohmic resistance to current flow through a relatively thin metal film on substrate face 106 substantially prevents electrochemical dissolution of metal at regions of substrate face 104 away from electropolishing head 432, 468 depicted in FIGS. 6 and 7, respectively.

Figure 9:
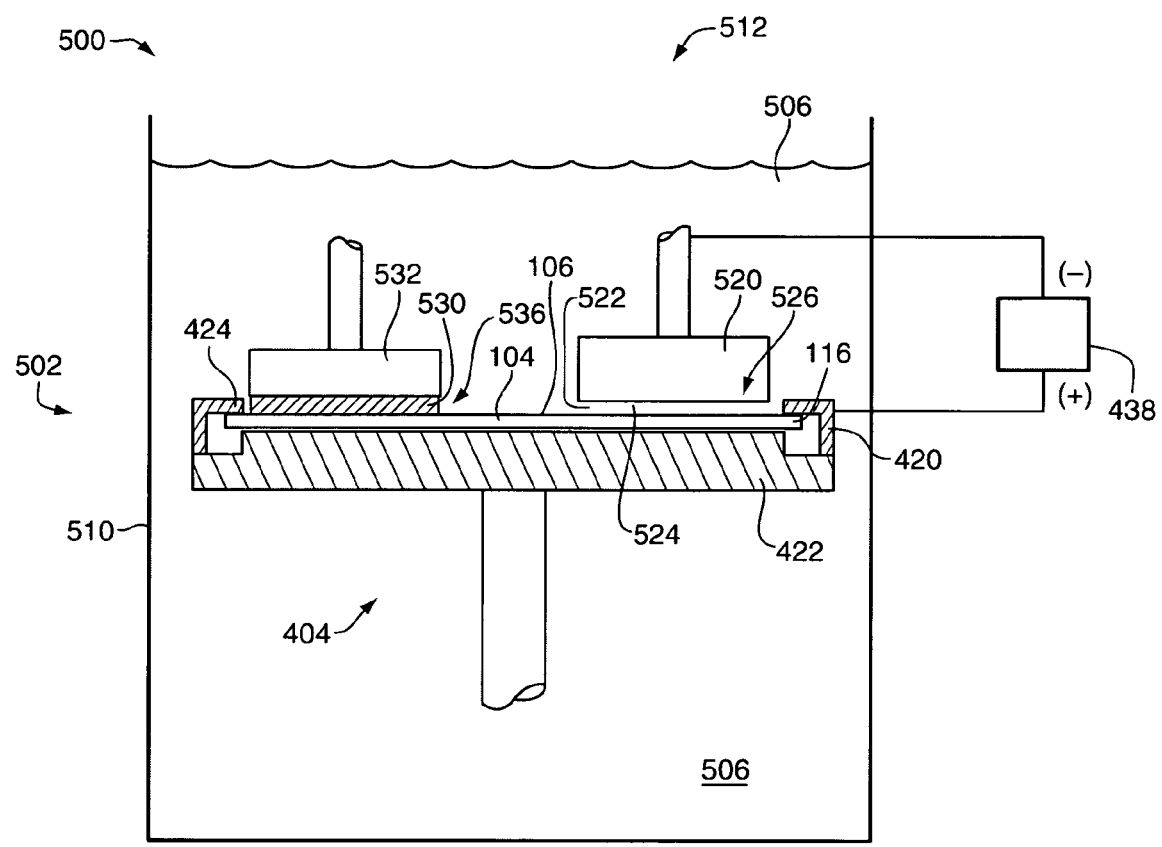
FIG. 9 depicts schematically a cross-sectional view of an apparatus in accordance with the invention in which a clamshell-type wafer holder, a buffing pad and an electropolishing head are immersed in an electropolishing bath.

FIG. 9 depicts schematically a cross-sectional view 500 of apparatus 502 during planarization of a wafer 104 in accordance with the invention. Apparatus 502 comprises a clamshell-type wafer holder 404. Wafer holder 404 and wafer 104 are immersed in electropolishing bath 506 located in containment chamber 510. Electropolishing bath 506 comprises electropolishing liquid 512. A compressible lip seal (e.g., similar to lip seal 488 depicted in FIG. 8) of lip 424 prevents electrolyte from contacting the backside of wafer 104 and the enclosed edge 116. Apparatus 502 includes cathodic electropolishing head 520 forming a thin gap 522 between electropolishing head 520 and substrate face 106. Electropolishing liquid 512 of electropolishing bath 506 fills thin gap 522, resulting in thin liquid layer 524 in thin gap 522. Electrical edge contacts located in wafer holder 404 effect electrical contact between side edge 116 of wafer 104 and a positive terminal of power supplies 438, as described with reference to FIGS. 6-8, above. These allow anodization of a portion or all of metal-containing substrate face 106. Electropolishing head 520 and thin liquid layer 524 define a corresponding first portion 526 of substrate face 106 that is electrochemically active when electropolishing head 520 is negatively biased and one or more electrical edge contacts (e.g., contacts 482 depicted in FIG. 8) are positively biased.

Buffing pad 530 on pad support 532 is in physical contact with a second, buffing portion 536 of substrate face 106. Generally, buffing pad 530 is electrically unbiased. Also, in some embodiments, electrical edge contacts proximate to buffing portion 536 of substrate face 106 are not connected with power supplies, so substrate face 106 at buffing portion 536 is not electrically biased. Furthermore, buffing pad 530 typically forces electropolishing liquid substantially away from buffing portion 536. As a result, buffing portion 536 of substrate face 106 is electrochemically inactive. Additionally, even in embodiments in which electrical edge contacts proximate to buffing portion 536 provide electrical contact to a power supply and in which some electropolishing liquid is present at buffing portion 536 or at other regions away from electropolishing head 520, strong ohmic resistance in a thin metal film on substrate face 106 typically substantially prevents electrochemical action at buffing portion 536 or at other regions of substrate face 106 away from electropolishing head 520.

Figure 10:
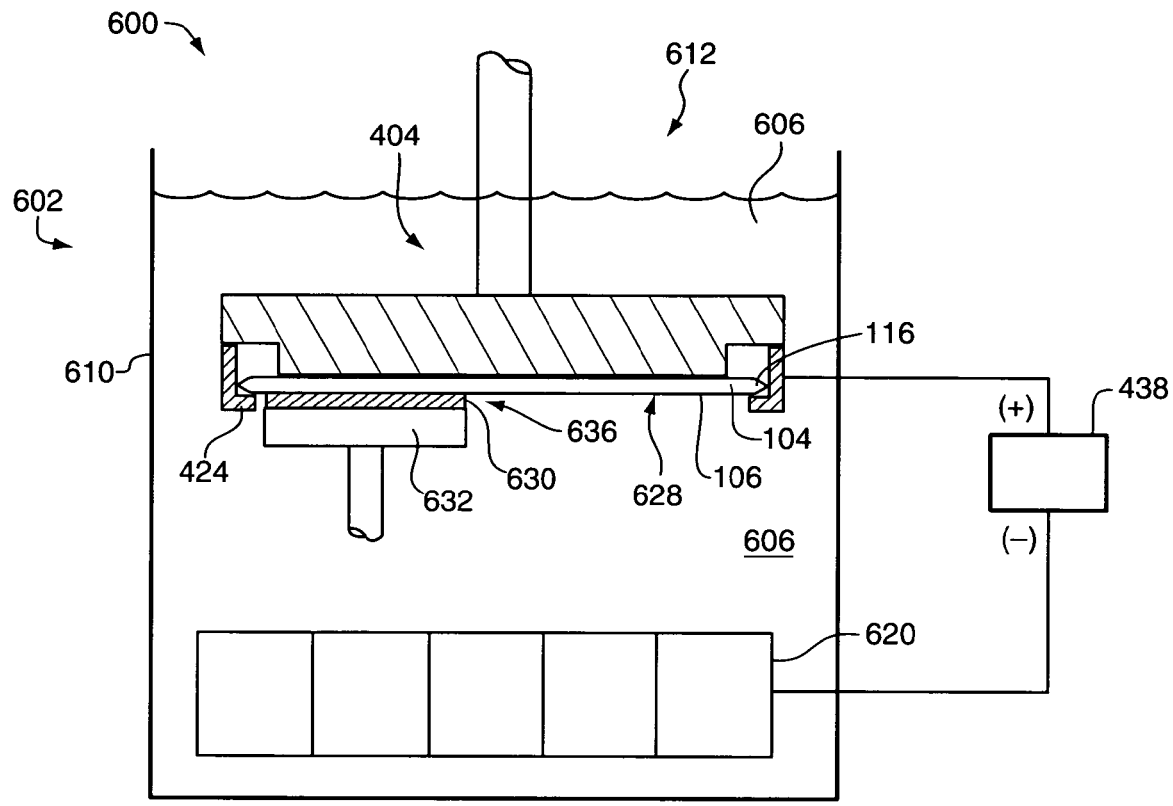
FIG. 10 depicts schematically a cross-sectional view of an apparatus having a circular cathode, a buffing pad, and a clamshell-type wafer holder immersed in an electropolishing bath.

FIG. 10 depicts schematically a cross-sectional view 600 of apparatus 602 during planarization of a wafer 104 in accordance with the invention. Apparatus 602 comprises a clamshell-type wafer holder 404. Wafer holder 404 and wafer 104 are immersed in electropolishing bath 606 located in containment chamber 610. Electropolishing bath 606 comprises electropolishing liquid 612. A compressible lip seal (e.g., similar to lip seal 488 as described in FIG. 8) prevents electropolishing liquid 612 from contacting the backside of wafer 104 and enclosed edge 116. Apparatus 602 includes cathode 620 located in electropolishing bath 606 substantially opposite to substrate face 106. Electropolishing liquid 612 of electropolishing bath 606 fills otherwise unoccupied space between cathode 620 and substrate wafer 104. Electrical edge contacts located in wafer holder 404 effect electrical contact between side edge 116 of wafer 104 and a positive terminal of power supplies 438, as described with reference to FIGS. 6-8, above. These allow anodization of a portion 628 or all of metal-containing substrate face 106. When cathode 620 and at least a portion of substrate face 106 are electrically biased as depicted in FIG. 10 and one or more power supplies 438 provides sufficient current, then electrochemical dissolution of metal, for example, copper or copper alloy, occurs at substrate face 106. Buffing pad 630 on pad support 632 is in physical contact with a buffing portion 636 of substrate face 106. Generally, buffing pad 630 is electrically unbiased. In some embodiments, electrical edge contacts proximate to a first portion 628 of substrate face are actively connected to power supplies, while electrical contacts proximate to a buffing portion 636 of substrate face 106 are not connected with power supplies. As a result, substrate face 106 at buffing portion 636 is not electrically biased and no electrochemical dissolution occurs at buffing portion 636. Furthermore, buffing pad 630 typically pushes electropolishing liquid substantially away from buffing portion 630 and shields the surface from the electric field located in plating bath 606 between cathode 620 and wafer 104. As a result, even if electrical contacts proximate to buffing portion 636 provide connection to a power supply, the substantial absence of electropolishing liquid at buffing portions 630 results in substantial electrochemical inactivity at buffing portions 630. Additionally, even in embodiments in which electrical edge contacts proximate to buffing portion 636 provide electrical contact to a power supply and in which some electropolishing liquid is present at buffing portion 636, the field-blocking effect of shielding by pad 630 as well as strong ohmic resistance in a thin metal film on substrate face 106 typically substantially prevent electrochemical action at buffing portion 636.

In preferred embodiments of an apparatus 602, various structures and techniques are used for controlling and shaping the electric field between cathode 620 and substrate 104, as disclosed in co-owned U.S. patent application Ser. No. 10/916,374, filed Aug. 10, 2004, in co-owned U.S. patent application Ser. No. 10/274,755, filed Oct. 21, 2002, and in co-owned U.S. Pat. No. 6,755,954, issued Jun. 29, 2004, to Mayer et al., which are incorporated by reference.

A variation of an embodiment similar to apparatus 602 includes two or more buffing pads, as described above with reference to apparatus 462 depicted in FIG. 7. For example, a second buffing pad is useful for physically buffing a region near the center of wafer 104, especially when wafer 104 is being rotated and the second buffing pad is reciprocated or otherwise moved relative to wafer 104 to provide sufficient work for physical buffing. The field-blocking effect of shielding by a second pad as well as strong ohmic resistance in a thin metal film on substrate face 106 typically substantially prevent electrochemical action at a portion shielded by the second pad as it physically buffs the portion. When the pad is translated parallel to the substrate face away from a particular portion, however, the shielding effect is removed and electrochemical dissolution may occur, depending on the current density at the particular portion. Similarly, when the reciprocating motion of a buffing pad moves the pad cyclically away from a particular point on the substrate face, the shielding effect of the pad is removed and electrochemical dissolution may occur at the particular point, depending on the current density at the particular point.

Figure 11:
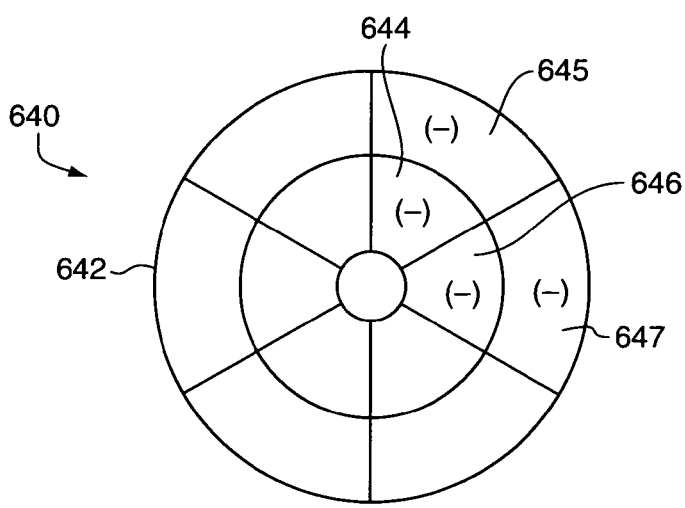
FIG. 11 depicts schematically a top view of a preferred embodiment of a variable segmented cathode suitable for an apparatus depicted in FIG. 10.

FIG. 11 depicts schematically a top view 640 of a preferred embodiment of a cathode suitable for apparatus 602. Variable segmented cathode 642 allows the electric field and the current density between cathode 642 and an anodized portion of substrate face 106 to be better controlled than if the cathode were not segmented. FIG. 11 depicts a state of cathodization of cathode 642 in which cathode segments 644, 645, 646 and 647 are negatively biased, while remaining segments of circular anode 642 are substantially unbiased. Selective positive biasing of a corresponding portion 628 of substrate face 106 opposite negatively biased cathode segments 644, 645, 646 and 647 causes electrochemical dissolution of metal at portion 628, with relatively little electrochemical dissolution at other areas of substrate face 106 that are exposed to electropolishing liquid. As described above with reference to FIG. 10, as a practical matter, substantially no electrochemical dissolution occurs at buffing portion 630, even when buffing portion 630 is inadvertently anodized.

In some embodiments in which the substrate wafer is rotated during planarization, the center of the wafer is a singularity at which virtually no work is generated by rotation of the wafer and which does not rotate sequentially between electrochemical action and physical buffing. For example, in embodiments in which the buffing pad is a semicircle having a footprint covering one half of the substrate wafer, and an electropolishing head or an immersed cathode (e.g., cathode 620) generates an electric field having a current density and electrochemical anodic dissolution at the other half of the substrate wafer that is not under the buffing pad, any point on the substrate face of a rotating substrate that is not at the center undergoes anodic dissolution one half of the time and physical buffing the other half of the time. The center of the wafer, however, does not rotate into and out of electrochemical and buffing zones sequentially. The singularity represented by the center of the wafer is accommodated using techniques to balance the dwell times of electrochemical action and physical buffing. For example, in some embodiments, the location of a reciprocating buffing pad and the amplitude of its reciprocating movements are selected so that the pad provides physical buffing and shielding from anodic dissolution during one part of its reciprocating cycle, and exposure to anodic dissolution during another part of its reciprocating cycle, so that the center experiences effective dwell times of electrochemical anodic dissolution and physical buffing similar to the dwell times of other points on the wafer substrate.

Figure 12:
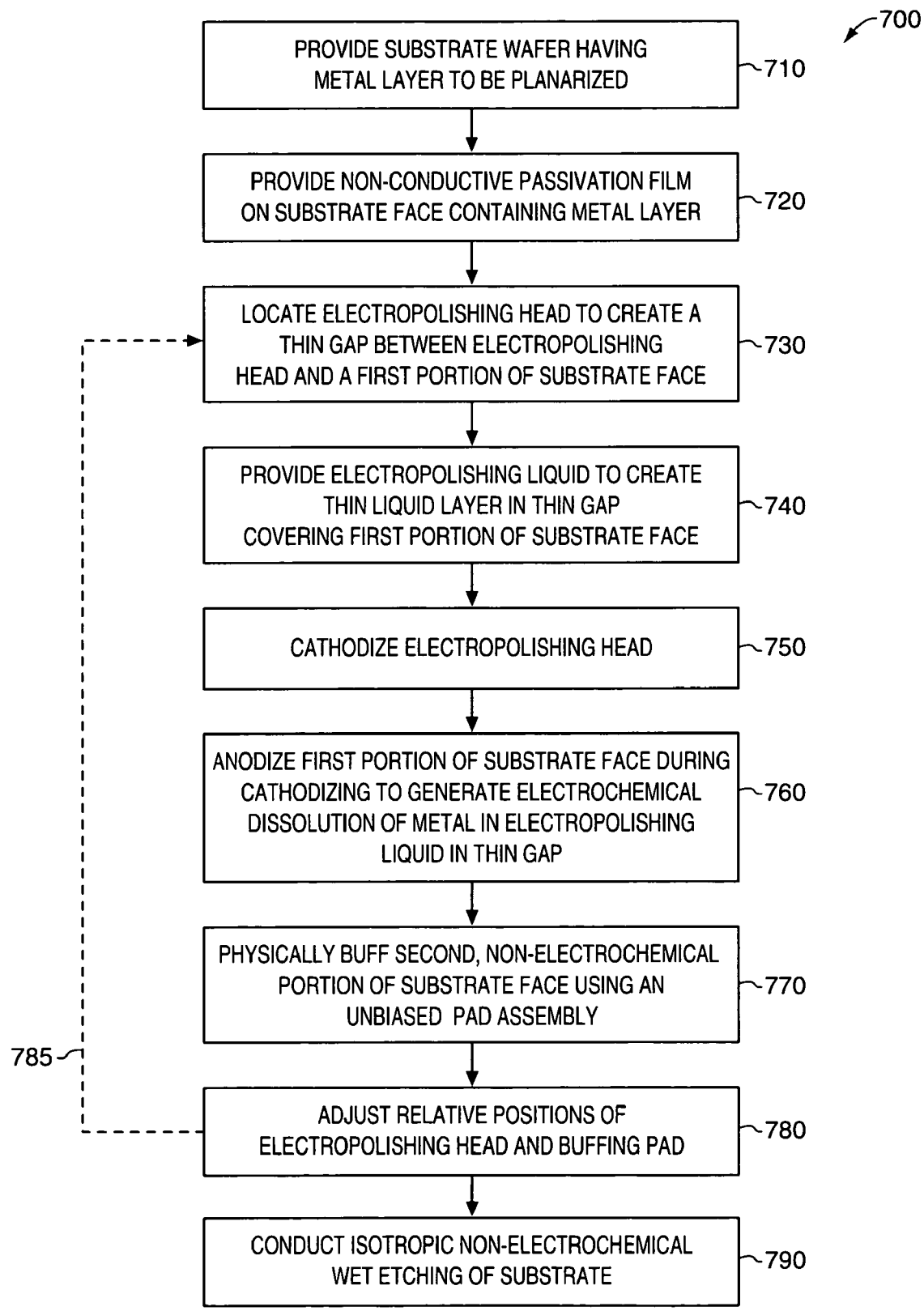
FIG. 12 contains a generalized process flow sheet of a method in accordance with the invention for planarizing a substrate surface having a metal layer.
Figure 13:
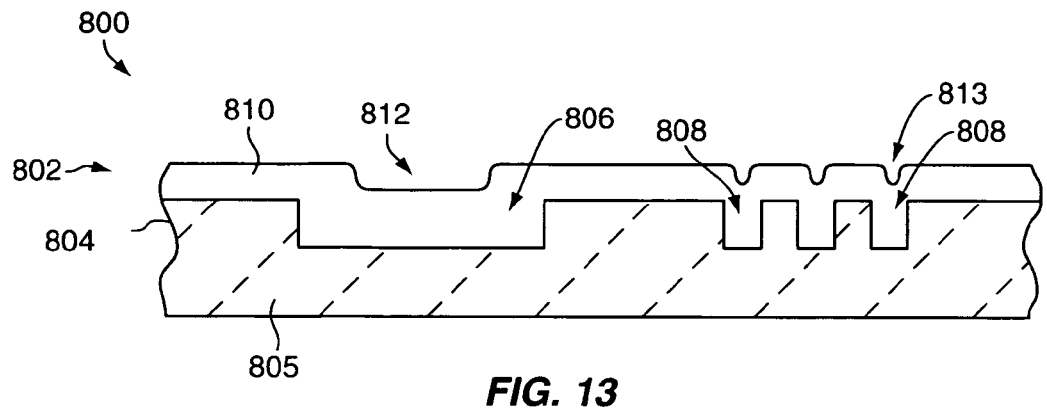
FIG. 13 depicts schematically a cross-sectional view of a section of an integrated circuit substrate wafer covered by electroplated copper having a large recessed area over a low aspect-ratio feature, and small recessed areas over high aspect-ratio features.
Figure 14:
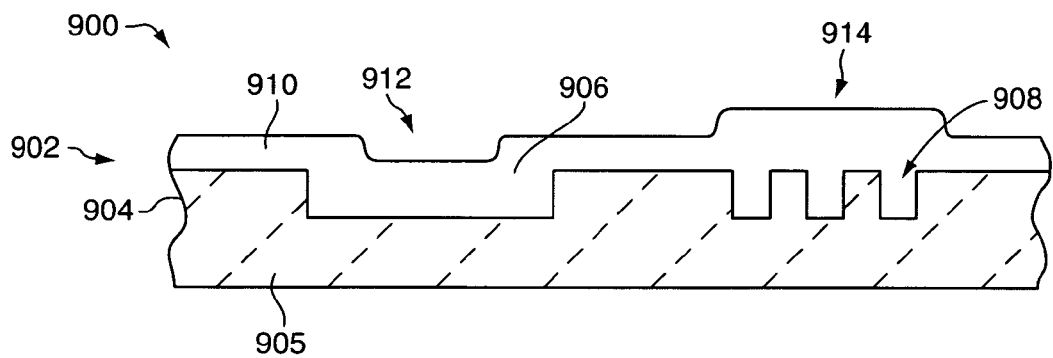
FIG. 14 depicts schematically a cross-sectional view of a section of an integrated circuit substrate wafer after electroplating of copper using rapid bottom-up electrofilling techniques resulting in a large recessed area over a low aspect-ratio feature, and a hump from overplating over high aspect-ratio features.

FIG. 12 contains a generalized process flow sheet of a preferred method 700 in accordance with the invention for planarizing a substrate surface having a metal layer. Method 700 including processes 710-790 is explained herein with reference to FIGS. 1-9 and 14-21. It is understood, however, that methods in accordance with the invention may be practiced using different sequences of processes as presented in FIG. 12, and using different materials and apparatus than described herein, to planarize workpieces that are different than those described in detail herein. A method in accordance with the invention is particularly useful for planarizing a substrate having a metal layer that fills low aspect-ratio features and high aspect-ratio features of an integrated circuit substrate as depicted in FIGS. 13, 14. FIG. 13 depicts schematically a cross-sectional view 800 of a section 802 of an integrated circuit substrate wafer 804. Wafer 804 includes a conventional dielectric layer 805, typically comprising doped or undoped silicon oxide. Dielectric layer 805 comprises low aspect-ratio features 806 and high aspect-ratio features 808. Typically, a diffusion barrier/adhesion layer (not shown) is deposited on dielectric layer 805, and then a metal interconnect layer 810 is deposited by electroplating on wafer substrate 804 to fill features 806, 808. Electroplating and other deposition methods of the prior art generally yield conformal deposition that leave large recessed areas 812 over low aspect-ratio features, and small recessed areas (nips) 813 over high aspect-ratio features. Commonly, electroplating baths for depositing copper, copper alloys and other metals contain additives to promote rapid "bottom-up" filling of higher aspect-ratio features to insure homogeneous metal fill of these narrow features. In such cases, plating occurs at an accelerated rate after completing the small feature filling stage. As a result, as depicted in FIG. 14, a hump of metal forms on the substrate above high aspect-ratio features, which is often referred to as "overplating" or "momentum plating". Methods and apparatus in accordance with the invention are useful for removing excess copper from substrate 804 to form metal wiring and interconnects in the features.

FIG. 14 depicts schematically a cross-sectional view 900 of a portion 902 of an integrated circuit substrate wafer 904. Wafer 904 includes a conventional dielectric layer 905, typically comprising doped or undoped silicon oxide. Dielectric layer 905 comprises low aspect-ratio features 906 and high aspect-ratio features 908. A metal interconnect layer 910 has been deposited on wafer substrate 904 by electroplating using rapid bottom-up electrofilling techniques to fill features 906, 908. The electroplating has resulted in large recessed area 912 over low aspect-ratio feature 906, and a hump 914 from overplating over high aspect-ratio features 908. In processes 710 of method 700, a substrate wafer, such as wafer 904 of FIG. 14, having a metal layer 910 to be planararized is provided. Typically, a substrate wafer is held in a wafer holder having electrical edge contacts, as described in co-owned and co-pending U.S. patent application Ser. No. 10/739,822, filed Dec. 17, 2003, by Mayer et al., and as depicted generally in FIGS. 1-3. In order to effect electrical contact with the substrate face and thereby anodize the substrate, a substrate wafer having a metal layer at its side edge is provided. Accordingly, a substrate wafer is provided for planarization in accordance with the invention before edge bevel removal (EBR) of metal is conducted.

Figure 15:
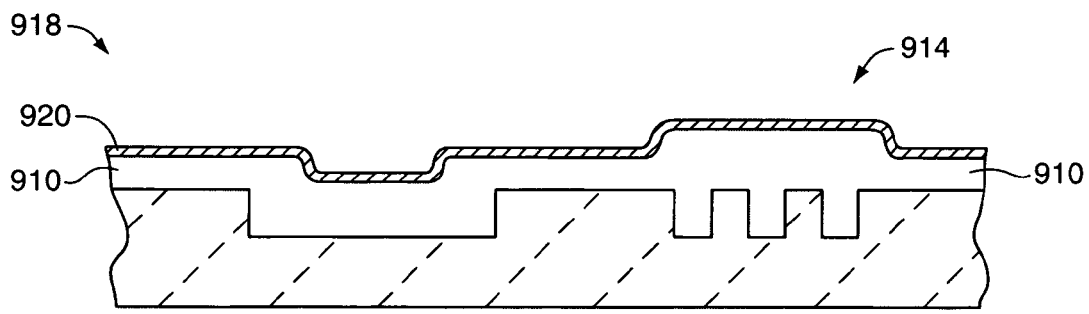
FIG. 15 depicts schematically a cross-sectional view of the substrate wafer of FIG. 14 in a later stage of fabrication in which a passivation layer covers the copper layer.

FIG. 15 depicts schematically a cross-sectional view 918 of substrate wafer 904 of FIG. 14 in a later stage of fabrication in which a substantially nonconductive passivation layer 920 covers copper layer 910. Passivation layer 920 typically forms in one of several ways. For example, U.S. Pat. No. 6,315,883, issued Nov. 13, 2001, to Mayer et al., which has been incorporated by reference, teaches a method of planarization of metal layers in which a diffusion-barrier mask is selectively applied to features having relatively low aspect ratios to inhibit electrochemical reaction in the masked areas. In some embodiments, passivation layer 920 is formed electrochemically. Also, during electrochemical dissolution of metal, reaction products sometimes form or are deposited on the metal surface of the substrate. These products often interfere with mass diffusion and/or reaction at the substrate surface, thereby inhibiting electrochemical dissolution at the metal surface of the substrate. For example, a film containing an oxide of copper typically forms on the copper layer of a substrate wafer during electrochemical dissolution of copper. Alternatively or additionally, a passivation layer comprising a nonconductive diffusion barrier and/or a kinetic inhibitor is applied in optional processes 720. A passivation layer is intentionally applied to a substrate surface in processes 720 so that electrochemical dissolution of metal is inhibited at relatively recessed areas of the substrate compared to electrochemical dissolution at raised areas of the metal layer, such as hump 914, from which the passivation layer is removed by buffing. Typically, this is accomplished by mechanically polishing (i.e., buffing) passivation layer 920 off the substrate selectively at raised areas, while leaving passivation layer 920 at lower and recessed areas. As depicted in FIG. 15, passivation layer 920 is conformal. In other embodiments, a planar passivation layer is formed intentionally on a substrate.

Figure 16:
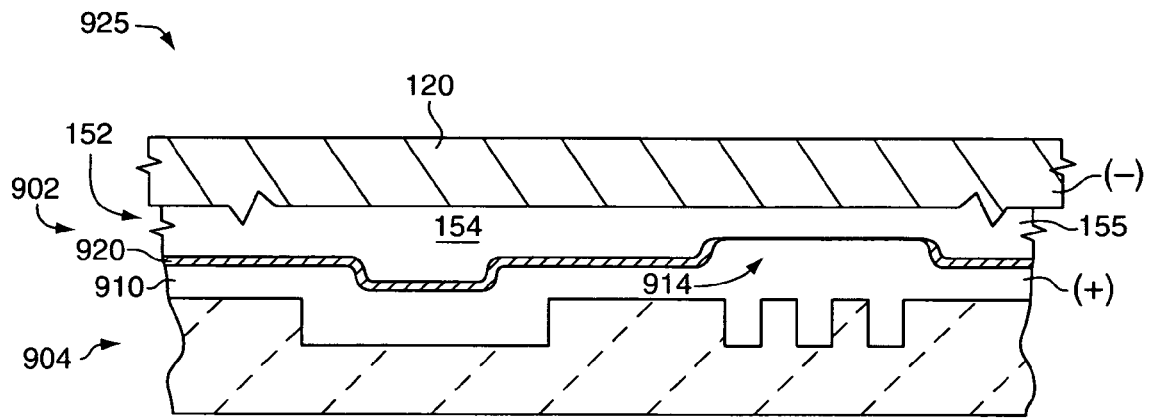
FIG. 16 depicts schematically a cross-sectional view of the substrate of FIG. 15 in a later stage of fabrication in which a portion of the passivation layer has been removed from hump region of the metal layer, and in which a thin liquid layer of electrolytic electropolishing liquid is located in a thin gap between a cathodic electropolishing head and the anodic substrate face.

FIG. 16 depicts schematically a cross-sectional view 925 of substrate 904 in a later stage of fabrication in which a portion of passivation layer 920 has been removed from hump region 914 of metal layer 910. Also, in processes 730, an electropolishing head 120 is located proximate to portion 902 of wafer substrate 904. Electropolishing head 120 forms a thin gap 152 between electropolishing head 120 and the substrate. Gap 152 typically has a width in a range of about from 0.5 mm to 10 mm. In processes 740, electrolytic electropolishing liquid is provided to create a thin liquid layer 154 of electropolishing liquid 155 in thin gap 152. In processes 750, electropolishing head 120 is cathodized so that it has a negative electrical bias. At the same time, in processes 760, portion 902 of substrate 904 is anodized by providing a positive bias. A DC current is thereby generated in electropolishing liquid 155, resulting in electrochemical dissolution of copper metal at hump region 914, which is exposed to electropolishing liquid 155. In some embodiments, a reference electrode is used to control the electrochemical dissolution rate. At relatively recessed areas of metal layer 910 which are still covered by passivation layer 920, electrochemical dissolution is substantially inhibited. During processes 730, 740, 750 and 760 at portion 902 of substrate 904, buffing processes 770 are being conducted simultaneously at another portion (not shown) of substrate 904. The term "electropolishing liquid" is used broadly to include media besides liquids, such as slurries and suspensions.

Figure 17:
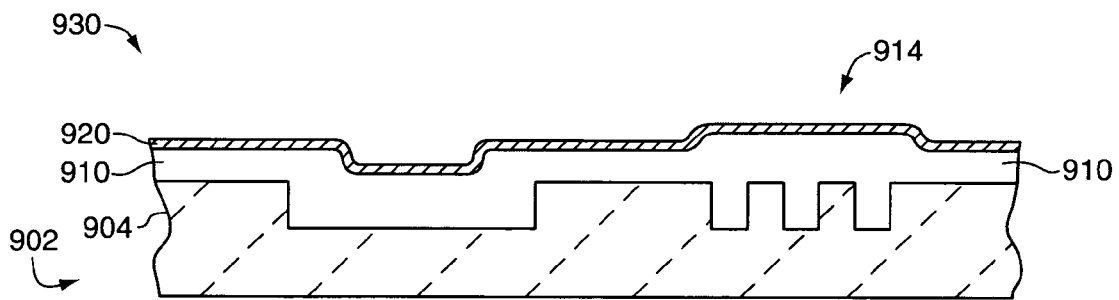
FIG. 17 depicts schematically a cross-sectional view of the portion of the substrate depicted in FIG. 16 in a later stage of fabrication in which a passivation film has re-formed on the metal layer at the hump region as a result of electrochemical dissolution of part of the hump.

FIG. 17 depicts schematically a cross-sectional view 930 of portion 902 of substrate 904 in a later stage of fabrication in which a passivation film has re-formed on metal layer 910 at hump region 914 as a result of electrochemical dissolution, as described above with reference to FIG. 16.

Figure 18:
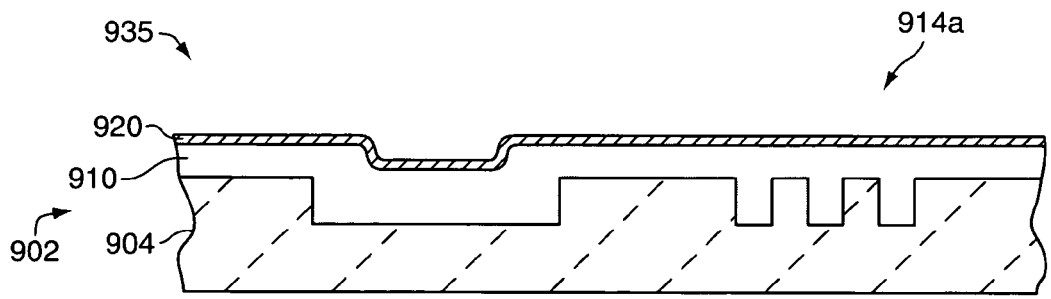
FIG. 18 depicts schematically a cross-sectional view of the portion of the substrate depicted in FIG. 17 in a later stage of fabrication after a sequence of processes in which: firstly, a portion of passivation layer was removed from the hump region by physical buffing; then, electrochemical dissolution of exposed metal of copper metal layer at the hump region was conducted as explained above with reference to FIG. 16, resulting in re-formation of a passivation film in the electrochemically dissolved hump region.

FIG. 18 depicts schematically a cross-sectional view 935 of portion 902 of substrate 904 in a later stage of fabrication after a sequence of processes in which: firstly, a portion of passivation layer 920 was removed from region 914 (FIG. 17) by physical buffing processes 770; then, electrochemical dissolution of exposed metal of copper metal layer 910 at hump region 914 was conducted as explained above with reference to FIG. 16, resulting in re-formation of a passivation film in area 914a where electrochemical dissolution occurred.

Figure 19:
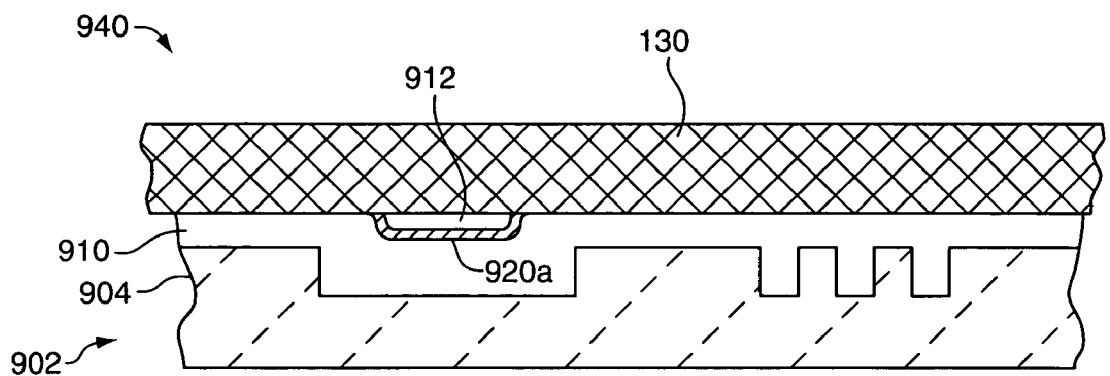
FIG. 19 depicts schematically a cross-sectional view of the portion of the substrate depicted in FIG. 18 in a later stage of fabrication in which the passivation layer has been substantially removed from the substrate portion by physical buffing with the buffing pad.

FIG. 19 depicts schematically a cross-sectional view 940 of portion 902 of substrate 904 in a later stage of fabrication in which passivation layer 920 has been substantially removed from substrate 904 during processes 770 by physical buffing with buffing pad 130. A portion 920a of passivation layer remains in recessed area 912. It is understood that during physical buffing processes 770 at portion 902 of substrate 904, electrochemical processes 730, 740, 750 and 760 are simultaneously conducted at another portion (not shown) of substrate 904. Thus, a method in accordance with the invention typically comprises processes 780, in which the relative positions of electropolishing head 120 and buffing pad 130 are adjusted during planarization of the substrate. Typically, a substrate wafer is rotated during electropolishing in accordance with the invention. In such embodiments, adjusting relative positions of the electropolishing head and the buffing pad is effected by rotating the substrate. In embodiments in which the substrate wafer is rotated, the first, electrochemical portion and a second, buffing portion of the substrate face, at which anodic dissolution and physical buffing occur, respectively, move continuously around the substrate face, depending on the rotation rate and the working areas of the electrochemical portion and of the buffing pad. In some embodiments, the substrate is not rotated during electropolishing. In such embodiments, adjusting relative positions of the electropolishing head and the buffing pad is effected by translating the electropolishing head and the buffing pad parallel to the substrate face.

Figure 20:
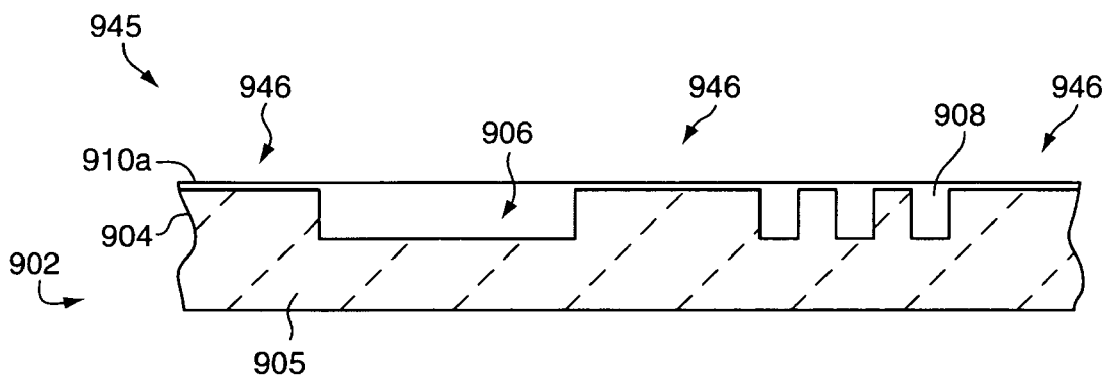
FIG. 20 depicts schematically a cross-sectional view of the portion of the substrate depicted in FIG. 19 in a later stage of fabrication after repeating one or more times sequence of processes as depicted in FIGS. 16-19 so that most of the copper in the field regions of the dielectric layer has been removed, resulting in a copper metal layer that comprises minor amounts of copper in field regions and that fills the low aspect-ratio feature and the high aspect-ratio features.

FIG. 20 depicts schematically a cross-sectional view 945 of portion 902 of substrate 904 in a later stage of fabrication after repeating one or more times (as indicated by dashed arrow 785 in FIG. 12) a sequence of processes 730, 740, 750, 760, 770 and 780 as described above with reference to FIGS. 16-19. As a result, most of the copper in the field regions 946 of dielectric layer 905 has been removed, resulting in copper metal layer 910a, which comprises minor amounts of copper in field regions 946 and which fills low aspect-ratio feature 906 and high aspect-ratio features 908.

Figure 21:
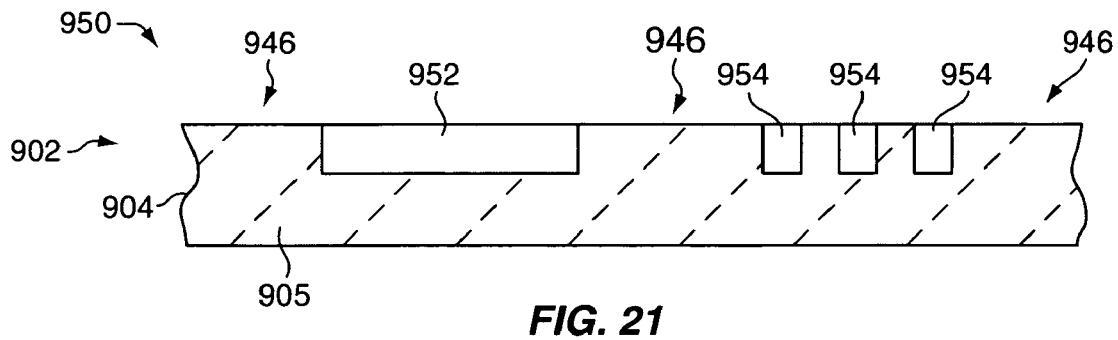
FIG. 21 depicts schematically a cross-sectional view of the portion of the substrate depicted in FIG. 20 in a later stage of fabrication in which the portion comprises electrically-separated, planararized metal interconnects embedded in the dielectric layer.

Preferred embodiments of method 700 include processes 790 after a substrate has been substantially planararized, to remove minor remnants of metal remaining in field areas. In processes 790, as depicted in FIG. 21, isotropic, non-electrochemical removal of material is conducted to remove remaining amounts of copper from field regions 946. Usually, in process 790, small amounts of dielectric material and metal also are isotropically removed from dielectric layer 905 and from the metal-filled features. FIG. 21 depicts schematically a cross-sectional view 950 of portion 902 of substrate 904 in a later stage of fabrication in which portion 902 comprises electrically-separated, planararized metal interconnects 952, 954 embedded in dielectric layer 905. Processes 790 typically include conventional isotropic wet etching techniques. A feature of the invention is that isotropic wet etching is conducted using conventional techniques in the same type of apparatus in which pad-assisted electropolishing processes 730, 740, 750, 760, 770, 780 and 785 are conducted. U.S. Pat. No. 6,315,883, issued Nov. 13, 2001, to Mayer et al., which is incorporated by reference, teaches utilizing processes that uniformly remove material from a substrate surface after electropolishing is completed so that field regions of dielectric layer are exposed. U.S. Pat. No. 5,486,234, issued Jan. 23, 1996, to Controlini et al., and co-owned and co-pending U.S. patent application Ser. No. 10/690,084, filed Oct. 20, 2003, by Koos et al., which are incorporated by reference, teach methods for etching metal and metal oxide from an integrated circuit substrate.

Materials for forming initial passivation layer 920 in processes 720 have been described in U.S. Pat. No. 6,709,565, issued Mar. 23, 2004, to Mayer et al., which is incorporated by reference. A passivation layer formed in processes 720 is essentially a diffusion barrier and/or a kinetically-inhibiting layer. Preferably, the passivation layer is soluble in an electrolytic electropolishing solution, because an electrolyte-soluble passivation layer is more easily removed with a non-abrasive buffing pad than an electrolyte-insoluble passivation layer. Examples of suitable, electrolyte-soluble, viscous liquid diffusion-barrier passivation-layer materials in accordance with the invention include concentrated phosphoric acid, concentrated sulfuric acid, boric acid, glacial acetic acid, ethylene glycol, propylene glycol, poly-oxy-ethylene glycols (of molecular weights varying from 100 to 20,000), poly-oxy-polypropylene glycols (of molecular weights varying from 100 to 20,000), and mixtures thereof. Typically, a passivation film deposited using processes 720 and/or the electropolishing liquid includes a salt of the material to be removed by electrochemical dissolution. For example, if the material to be removed is copper, a phosphoric acid film should have some salts of copper, including but not limited to copper sulfate ($CuSO_4$), copper phosphate ($Cu_3(PO_4)_2$), cupric monohydrogen phosphate ($CuHPO_4$), copper monohydroxy phosphate ($Cu_2(OH)PO_4$), and copper nitrate ($Cu(NO_3)_2$). Alternatively, $Cu_2O$, $CuO$ or $Cu(OH)_2$ is added to react with the acids to form water and a metal salt of the acid. Such salts are added to allow immediate plating of the polished metal on the electropolishing head (or other cathode) during electropolishing and thereby avoid generation of bubbles (mainly hydrogen) from the electrolysis of the electrolyte at the cathode. The concentration of copper salts in a passivation film formed in processes 720 is generally at least about 0.1 mole/liter, more preferably at least about 0.25 mole/liter, and most preferably at least about 0.5 mole/liter (up to the solubility limit of the metal ion in the solvent). Another component that may be added to the viscous liquid film may be a surface agent such as a wetting agent, a brightening agent, or an agent that effectively increases the kinetic overpotential to provide more uniform electropolishing over the substrate surface or deposition on the cathode, respectively. Examples of wetting agents include sodium lauryl sulfate (e.g., about from 0 to 2% by weight), and various copolymers of poly-oxy-ethylene glycol (PEG). Examples of brightening agents include coumarin, benzotriazole, MPS (mercaptopropane sulfonic acid), and SPS (dimercaptopropane sulfonic acid). Examples of materials that promote more uniform plating include polyethylene glycol, polyethylene oxide, poly-propylene oxide, poly-propylene glycol, and copolymers of any of these. Small amounts (10 to 100 ppm) of chloride ion may be added to aid in the surface absorption of these compounds. In addition, 0 to 1 mole/liter tetraethylammonium tetrafluoroborate or dodecyl trimethyl ammonium tetrafluoroborate (or other electrochemically-stable salts (oxidatively stable with respect to water)) may be used as a supporting electrolyte to reduce the overall potential drop of the electropolishing process, as well as to enhance the polishing performance.

Electrolytic electropolishing liquids suitable for use in accordance with the invention are well known in the art. In some embodiments, the electropolishing liquid is used as a buffing medium and comprises abrasive particles, such as silica and alumina particles. In contrast to conventional CMP techniques, an advantage of embodiments in accordance with the invention is the option of using oxidizer-free electropolishing and buffing media, which avoids uncontrolled, undesired oxidative etching of the substrate face. Electrochemical processes 730, 740, 750, and 760, and mechanical buffing processes 770 generally are conducted at room temperature.

In embodiments in which the substrate wafer is rotated, the rotation rate is typically in a range of about from 30 rpm to 200 rpm. In such embodiments, a given point on the face of the substrate is located in an anodized region of electrochemical dissolution (e.g., under a cathodic electropolishing head) for a total dwell time in a range of about from 0.5 second to two seconds. Similarly, in such embodiments, a given point on the face of the substrate is located under and buffed by a buffing pad for a total dwell time generally not less than 0.2 seconds, typically for a total dwell time in a range of about from 0.5 second to two seconds.

In embodiments in which the substrate wafer is not rotated, both electrochemical dissolution at a first portion of the substrate face and physical buffing with the buffing pad at a buffing portion are each conducted for a total time in a range of about from 0.2 seconds to five seconds, typically for a total dwell time in a range of about from 0.5 second to two seconds. It is understood that mechanical buffing of the substrate face at a portion of the substrate typically involves either rotation of the buffing pad or reciprocation of the buffing pad in small vibratory (orbital, linear or both) movements parallel to the plane of the substrate face, or both.

Generally, the pressure of the buffing pad on the substrate face is generally less than 1.0 psi (pounds per square inch), typically less than 0.5 psi, and preferably not exceeding 0.3 psi. A feature of the invention is that mechanical buffing of the substrate face using a buffing pad is conducted preferably with a nonabrasive pad. If a buffing medium is used, the buffing medium preferably is relatively nonabrasive also. If a buffing medium is used, the medium in some embodiments is oxidizer-free to avoid uncontrolled, undesired oxidative etching of the substrate face.

In some embodiments, the electropolishing solution is fresh, that is, it is substantially devoid of any reaction products. In other embodiments, electropolishing solution comprises recycled/recirculated solution from a collection tank. Significantly, the pad-rubbing processes remove a passivation layer or chemical passivating agent from the field areas of the substrate, and the differentials between electropolishing removal rates over the surface as a whole is significant.

In some embodiments, for example, when the integrated circuit substrate is being rotated, the substrate surface is alternately and repeatedly anodized and then selectively rubbed to create a selectively passivating region. Preferably these anodizing (with electrochemical dissolution) and buffing operations each have total time durations of at least about 0.2 second, and more preferably in a range of about from 0.5 second to two seconds. Typically, in embodiments employing apparatus as presented in FIGS. 1-11, the anodization accompanied by anodic dissolution and the selective mechanical buffing with the pad take place simultaneously on different portions of a work piece, each for total times exceeding about 0.2 second, and more preferably in a range of about from 0.5 second to two seconds. This "alternating process" may also be embodied in a relatively slow moving rubbing element passing over the work piece surface periodically to remove passivating film from field regions. In some embodiments, the electropolishing solution has one or more passivating agents that continually deposit on and passivate the work piece surface. In other embodiments, the plating solution is substantially free of such additives.

To obtain a uniformly planar substrate surface, planarization of the substrate surface preferably is monitored and controlled. Suitable monitoring of substrate topography enables feed-back control of electropolishing and pad-rubbing across a substrate surface. As a result, electropolishing and pad-rubbing are conducted to allow differential removal of material from a substrate surface. Accordingly, preferably analysis of the movement (translation) of the electropolishing-head (cathode) and the location of the active electrochemical area (first portion) of the anode-substrate are performed and relative movements (translation) of head 120 and pad 130 (FIG. 1) are modified appropriately. For example, in some embodiments, the active electrochemical area of electropolishing (first portion) is modified by having a portion of cathode-head 120 contain a non-active region (e.g., made of a plastic or other inner material). Alternatively, in embodiments such as depicted in FIG. 10, in which the substrate face is immersed in an electropolishing bath in which a cathode is located, various methods of field shaping can be used as known in the art (e.g., as described in U.S. Pat. No. 6,402,923, "Method and Apparatus for Uniform Electroplating of Integrated Circuits Using a Variable Field Shaping Element", issued Jun. 11, 2002, to Mayer et. al.). Still further, the cathode can be divided into various segments to spatially modify the total time and current density applied as a function of time, in a manner similar to that described in U.S. Pat. No. 6,773,571, titled "Method And Apparatus For Uniform Electroplating Of Thin Metal Seeded Wafer Using Multiple Segmented Virtual Anode Sources", issued Aug. 10, 2004, to Mayer et al., in U.S. patent application Ser. No. 10/609,518, filed Jun. 30, 2003, by Mayer et al., titled "Liquid Treatment Using Thin Liquid Layer", U.S. patent application Ser. No. 10/916,374, filed Aug. 10, 2004, and in U.S. patent application Ser. No. 10/916, 374, filed Aug. 10, 2004, which are incorporated by reference. In some embodiments, the wafer is rotated so that a given area of substrate moves between a buffed region under the buffing pad 130 and an electrochemically-active region under thin-film electropolishing head 120. Depending on the stage of the process and the desired results, the pad may or may not be engaged to remove passivating film from the surface at any particular time during the overall planarization operation. Similarly, the electropolishing head can be up and the buffing pad down during time periods in the process. Or, both the plating head and pad can be up, for application of electrolyte or rinsing.

FIG. 22 contains a generalized process flow sheet of an alternative method 960 in accordance with the invention for planarizing a substrate surface having a metal layer. Method 960 is described with reference to FIG. 10. Processes 962 include providing an electropolishing bath 606 containing electropolishing liquid 612 in a processing chamber 604. In some embodiments, electropolishing bath 606 also contains abrasive particles in a slurry that serves as a buffing medium during physical buffing. The sizes of the abrasive particles (e.g., alumina, silica) are selected to balance efficiency of removing passivating material, on the one hand, and avoidance of dishing of the substrate surface, on the other hand. Processes 962 also include providing a cathode 620 immersed in electropolishing bath 606. In preferred embodiments, cathode 620 is a variable cathode, such as cathode 642 depicted in FIG. 11. Optional processes 964 include applying a non-conductive diffusion-barrier/kinetically-inhibiting film on the substrate face, such as passivation layer 920 described with reference to FIG. 15. Processes 966 include immersing the substrate wafer into electropolishing bath 606, as depicted in FIG. 10. Processes 968 include anodizing at least a first portion of the substrate face. In preferred embodiments, substrate wafer is held in a wafer holder having electrical edge contacts that are selectively controlled to provide current that is localized at a portion of the substrate face, as described with reference to FIGS. 1-9. The resulting DC current between the substrate and electrolytic electropolishing liquid generates electrochemical dissolution of the metal at the substrate face (except at buffing portion 636). Processes 970 include physically buffing a buffing portion of the substrate face, preferably using an electrically unbiased buffing pad, to remove portions of the passivation layer from raised areas of the substrate face. Buffing also removes passivating material that forms on and covers the metal layer being planararized as a result of electrochemical dissolution of metal. Some embodiments include buffing the substrate face using two or more buffing pads simultaneously. In such embodiments, typically at least one outer buffing pad is located to buff the outer periphery of the substrate face including the areas adjacent to lip 424 of wafer holder 404, and the work of buffing is provided by the rotation of the wafer, and at least one central buffing pad is located towards the center of the wafer (such as pad 464 in FIG. 7), and the work of buffing by the central buffing pad is provided by its reciprocating motion. After electrochemical dissolution at first portion 628 and physical buffing at second, buffing portion 636 has been conducted to a certain extent, the relative locations of the anodized portion and the buffing pad are adjusted in processes 972; for example, by rotating the wafer, or by translating the buffing pad assembly. Typically, electrochemical dissolution at a given first portion of the substrate and buffing of a second, buffing portion of the substrate are conducted simultaneously for a total dwell time in a range of about from 0.2 seconds to five seconds, more typically in a range of about from 0.5 second to two seconds. Optionally, monitoring of metal-removal allows feedback control so that relative positions of electrochemical action and buffing action are adjusted in processes 972 only after a certain amount of metal has been electrochemically dissolved at the first portion or after a certain amount of passivation layer has been physically removed from a second portion. As indicated by dashed repeat-line 974, processes 968, 970 and 972 are repeated until the metal layer has been planararized, as depicted in FIG. 20. Preferred embodiments of method 960 include processes 976 after a substrate has been substantially planararized, with only minor remnants of metal remaining in field areas. In processes 976, as depicted in FIG. 21, isotropic, non-electrochemical removal of material is conducted to remove remaining amounts of copper from field regions 946, and usually small amounts of dielectric material and metal are isotropically removed from dielectric layer 905 and from metal-filled features.

It is understood that it is possible at times to conduct only electropolishing without physical buffing, or to conduct only physical buffing without electropolishing. For example, after a substrate wafer has been substantially planararized, it is often useful to conduct only electropolishing processes. In some embodiments, anodization to generate electrochemical dissolution and physical buffing are conducted concomitantly, in a cyclic manner, rather than simultaneously.

Although the systems described in this specification have been described with reference to electropolishing, systems in accordance with the invention are also useful for conducting electroplating operations by making slight modifications to the systems (e.g., by switching the polarity of power supplies and by replacing electropolishing liquid with an electroplating solution).

The particular systems, designs, methods and compositions described herein are intended to illustrate the functionality and versatility of the invention, but they should not be construed to limit the invention to those particular embodiments. Systems and methods in accordance with the invention are useful in a wide variety of circumstances and applications to conduct pad-assisted electropolishing of an integrated circuit substrate. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, methods and compositions described in the claims below and by their equivalents.

The invention claimed is:

1. A method of planarizing a substrate face comprising processes of:
   providing a substrate wafer having a substrate face comprising metal, said substrate face defined by a side edge;
   providing an electropolishing head proximate to a first portion of said substrate face to create a thin gap between said electropolishing head and said first portion;
   providing an electropolishing liquid to create a thin liquid layer in said thin gap covering at least said first portion of said substrate face;
   cathodizing said electropolishing head;
   anodizing at least said first portion of said substrate face during said cathodizing to generate electrochemical dissolution of metal at said first portion; and
   physically buffing a second portion of said substrate face using a pad assembly, wherein substantially no electrochemical dissolution of metal occurs at said second portion;
   wherein said processes of anodizing at least said first portion of said substrate face comprise providing an electrical contact structure between a power source and said substrate wafer wherein no electrical contact structure physically contacts said substrate face.

2. A method of planarizing a substrate face as in claim 1 wherein:
   said pad assembly is substantially electrically unbiased with respect to said electropolishing liquid.

3. A method of planarizing a substrate face as in claim 1 wherein:
   said processes of anodizing and said processes of physically buffing are conducted simultaneously.

4. A method of planarizing a substrate face as in claim 1 wherein:
   said substrate face comprises a nominal surface area, said electropolishing head comprises an electropolishing area, and said buffing pad comprises a buffing area; and
   the sum area of said electropolishing area and said buffing area is less than said nominal surface area of said substrate face.

5. A method of planarizing a substrate face as in claim 1, further comprising:
   rotating said wafer substrate.

6. A method of planarizing a substrate face as in claim 1 wherein:
   said processes of cathodizing and anodizing to generate electrochemical dissolution are conducted for a total time period not less than about 0.2 seconds.

7. A method of planarizing a substrate face as in claim 1 wherein:
   said processes of physically buffing are conducted for a total time period not less than about 0.2 seconds.

8. A method of planarizing a substrate face as in claim 1 wherein:
   said pad assembly does not provide electrical contact of a power source to said wafer substrate.

9. A method of planarizing a substrate face as in claim 1 wherein:
   said pad assembly does not electrically bias said wafer substrate.

10. A method of planarizing a substrate face as in claim 1 wherein:

said processes of physically buffing said second portion comprise pressing said buffing pad against said substrate face contiguous to said side edge.

11. A method of planarizing a substrate face as in claim 10 wherein:
said processes of physically buffing said second portion comprise locating a portion of said buffing pad radially outward from said side edge.

12. A method of planarizing a substrate face as in claim 1, further comprising:
not physically contacting said head assembly with said substrate face during said anodizing and said cathodizing.

13. A method of planarizing a substrate face as in claim 1, further comprising:
removing material from said substrate face using a non-electrochemical process after conducting said electrochemical dissolution and said buffing processes.

14. A method of planarizing a substrate face as in claim 1 wherein:
said electropolishing liquid is substantially absent from said second portion of said substrate face during said physically buffing.

15. A method of planarizing a substrate face as in claim 1 wherein:
said side edge comprises a metal coating; and
said processes of anodizing comprise physically contacting said electrical contact structure with said side edge.

16. A method of planarizing a substrate face as in claim 15 wherein:
said substrate wafer comprises a bevel edge; and
said bevel edge comprises a metal coating.

17. A method of planarizing a substrate face as in claim 1 wherein:
said substrate wafer comprises a bevel edge; and
said bevel edge comprises a metal coating; and
said processes of anodizing comprise physically contacting said electrical contact structure with said bevel edge.

18. A method of planarizing a substrate face as in claim 1 wherein
said side edge comprises a metal coating and said processes of anodizing at least said first portion of said substrate face comprise:
providing a plurality of electrical contact structures between said power source and said substrate wafer; and
physically contacting at least one of said electrical contact structures with said side edge.

19. A method of planarizing a substrate face as in claim 1 wherein:
said processes of providing an electropolishing liquid comprise immersing said substrate face in an electropolishing bath located in an electropolishing chamber.

20. A method of planarizing a substrate face as in claim 1 wherein said processes of providing an electropolishing head create a thin gap between said electropolishing head and said first portion having a gap thickness in a range of about from 0.5 mm to 10 mm.

21. A method of planarizing a substrate face as in claim 1, further comprising:
physically buffing a third portion of said substrate face using a second pad assembly, wherein substantially no electrochemical dissolution of metal occurs at said third portion.

22. A method of planarizing a substrate face as in claim 21 wherein:
said processes of anodizing and said processes of physically buffing at said second and third portions are conducted simultaneously.

23. A method of planarizing a substrate face comprising processes of:
providing an electropolishing bath containing electropolishing liquid;
immersing a substrate wafer having a substrate face comprising metal in said electropolishing bath, said substrate face defined by a side edge;
anodizing at least a first portion of said substrate face to generate electrochemical dissolution of metal at said first portion;
physically buffing a second portion of said substrate face using a pad assembly, wherein substantially no electrochemical dissolution of metal occurs at said second portion; and
physically buffing a third portion of said substrate face using a second pad assembly, wherein substantially no electrochemical dissolution of metal occurs at said third portion.

24. A method of planarizing a substrate face as in claim 23 wherein:
said pad assembly is substantially electrically unbiased with respect to said electropolishing liquid.

25. A method of planarizing a substrate face as in claim 23 wherein:
said processes of anodizing and said processes of physically buffing are conducted simultaneously.

26. A method of planarizing a substrate face as in claim 1 wherein:
said processes of anodizing and said processes of physically buffing at said second and third portions are conducted simultaneously.

27. A method of planarizing a substrate face comprising processes of:
providing a substrate wafer having a substrate face, said substrate face defined by a side edge;
providing an electrical contact structure in physical contact with said substrate wafer but not in physical contact with said substrate face;
providing an electropolishing liquid to cover at least said first portion of said substrate face;
electrically biasing said first portion positively with respect to said electropolishing liquid to generate electrochemical dissolution of metal at least at said first portion;
physically buffing a second portion of said substrate face using a buffing pad of a pad assembly concomitantly with said biasing;
pressing said buffing pad against said substrate face contiguous to said side edge to buff a periphery of said second portion contiguous to said side; and
physically buffing a third portion of said substrate face using a second pad assembly.

28. A method of planarizing a substrate face as in claim 27 wherein:
said physically buffing a second portion of said substrate face comprises locating a portion of said buffing pad radially outward from said side edge during said buffing to buff a periphery of said second portion contiguous to said side edge.

29. A method of planarizing a substrate face as in claim 27 wherein:
said processes of anodizing and said processes of physically buffing at said second and third portions are conducted simultaneously.

30. A method of planarizing a substrate face comprising processes of:
  providing a substrate wafer having a substantially circular substrate face, said substrate face defined by a side edge;
  providing an electropolishing liquid to cover at least a first portion of said substrate face;
  electrically biasing said first portion positively with respect to said electropolishing liquid to generate electrochemical dissolution of metal at least at said first portion;
  physically buffing a second portion of said substrate face by reciprocating a buffing pad of a pad assembly concomitantly with said biasing, said buffing pad having a buffing surface area that is smaller than said substrate face; and
  physically buffing a third portion of said substrate face using a second pad assembly, wherein substantially no electrochemical dissolution of metal occurs at said third portion.

31. A method of planarizing a substrate face as in claim 30, wherein:
  providing a substrate wafer comprises providing a wafer holder holding said substrate wafer, wherein said wafer holder encloses said side edge.

32. A method of planarizing a substrate face as in claim 30, wherein:
  said processes of physically buffing said second portion comprise pressing said buffing pad of said pad assembly against said substrate face contiguous to said side edge to buff a periphery of said second portion contiguous to said side edge.

33. A method of planarizing a substrate face as in claim 30, wherein:
  said pad assembly does not electrically bias said wafer substrate.

34. A method of planarizing a substrate face as in claim 30 wherein:
  said processes of anodizing and said processes of physically buffing at said second and third portions are conducted simultaneously.

35. A method of planarizing a substrate face as in claim 30 wherein:
  said buffing surface is relatively large proximate to said side edge and relatively small distal from said side edge.

* * * * *

UNITED STATES PATENT AND TRADEMARK OFFICE
CERTIFICATE OF CORRECTION

| | | |
|---|---|---|
| PATENT NO. | : 7,686,935 B2 | Page 1 of 1 |
| APPLICATION NO. | : 11/213190 | |
| DATED | : March 30, 2010 | |
| INVENTOR(S) | : Mayer et al. | |

It is certified that error appears in the above-identified patent and that said Letters Patent is hereby corrected as shown below:

CLAIMS:
Column 30, line 53, add "edge".

Signed and Sealed this
Thirtieth Day of August, 2011

David J. Kappos
*Director of the United States Patent and Trademark Office*